(12) United States Patent
Okuno

(10) Patent No.: US 8,633,570 B2
(45) Date of Patent: Jan. 21, 2014

(54) METHOD FOR MANUFACTURING SOI SUBSTRATE AND SOI SUBSTRATE

(75) Inventor: Naoki Okuno, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 46 days.

(21) Appl. No.: 13/244,394

(22) Filed: Sep. 24, 2011

(65) Prior Publication Data

US 2012/0012986 A1 Jan. 19, 2012

Related U.S. Application Data

(63) Continuation of application No. 12/768,872, filed on Apr. 28, 2010, now Pat. No. 8,043,938.

(30) Foreign Application Priority Data

May 14, 2009 (JP) ................................. 2009-117263

(51) Int. Cl.
*H01L 29/06* (2006.01)

(52) U.S. Cl.
USPC .... 257/618; 438/458; 438/459; 257/E21.415; 257/E21.567; 257/E29.005

(58) Field of Classification Search
USPC .................. 438/151, 164, 458; 257/618, 728, 257/E21.214, E21.415, E29.005
See application file for complete search history.

(56) References Cited

U.S. PATENT DOCUMENTS

| | | | |
|---|---|---|---|
| 6,191,007 B1 | 2/2001 | Matsui et al. | |
| 6,362,078 B1 | 3/2002 | Doyle et al. | |
| 6,380,019 B1 | 4/2002 | Yu et al. | |
| 6,380,046 B1 | 4/2002 | Yamazaki | |
| 7,199,024 B2 | 4/2007 | Yamazaki | |
| 7,507,638 B2 | 3/2009 | Mancini et al. | |
| 2002/0109144 A1 | 8/2002 | Yamazaki | |
| 2007/0134891 A1 | 6/2007 | Adetutu et al. | |
| 2007/0173000 A1* | 7/2007 | Yamazaki | 438/151 |
| 2008/0242051 A1 | 10/2008 | Yamazaki et al. | |
| 2010/0081252 A1 | 4/2010 | Makino | |

FOREIGN PATENT DOCUMENTS

| | | | |
|---|---|---|---|
| JP | 05-211128 A | | 8/1993 |
| JP | 11-045862 A | | 2/1999 |
| JP | 2000-012864 A | | 1/2000 |
| JP | 2005-252244 A | | 9/2005 |
| JP | 2005252244 A | * | 9/2005 |

* cited by examiner

*Primary Examiner* — Alexander Ghyka
*Assistant Examiner* — Abdulfattah Mustapha
(74) *Attorney, Agent, or Firm* — Eric J. Robinson; Robinson Intellectual Property Law Office, P.C.

(57) ABSTRACT

A method is demonstrated to form an SOI substrate having a silicon layer with reduced surface roughness in a high yield. The method includes the step of bonding a base substrate such as a glass substrate and a bond substrate such as a single crystal semiconductor substrate to each other, where a region in which bonding of the base substrate with the bond substrate cannot be performed is provided at the interface therebetween. Specifically, the method is exemplified by the combination of: irradiating the bond substrate with accelerated ions; forming an insulating layer over the bond substrate; forming a region in which bonding cannot be performed in part of the surface of the bond substrate; bonding the bond substrate and the base substrate to each other with the insulating layer therebetween; and separating the bond substrate from the base substrate, leaving a semiconductor layer over the base substrate.

29 Claims, 21 Drawing Sheets

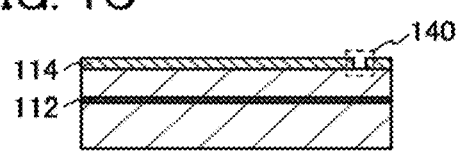
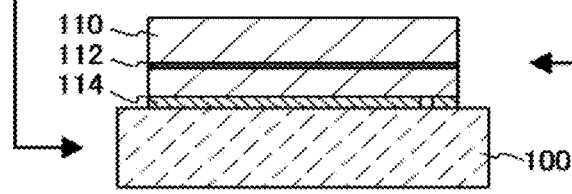
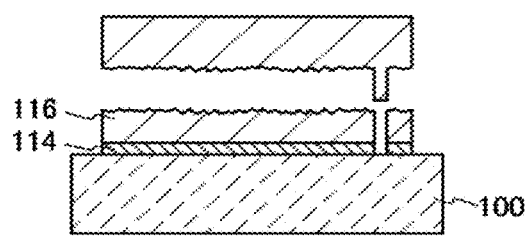
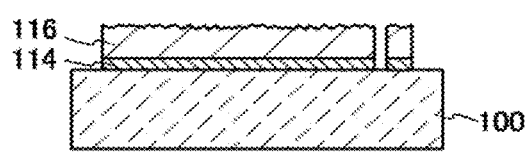

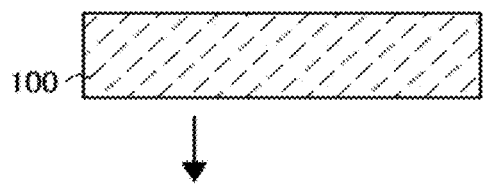
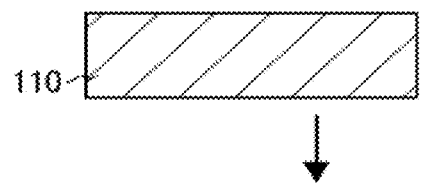
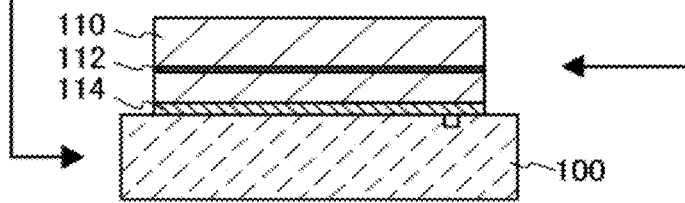
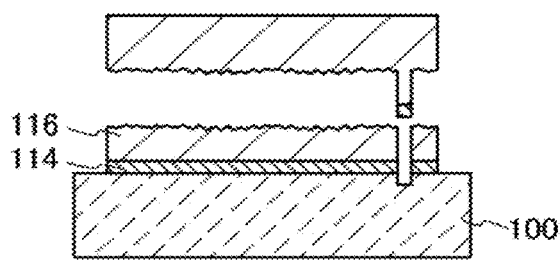
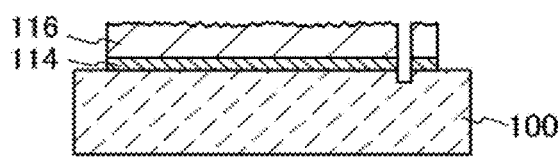

FIG. 8A
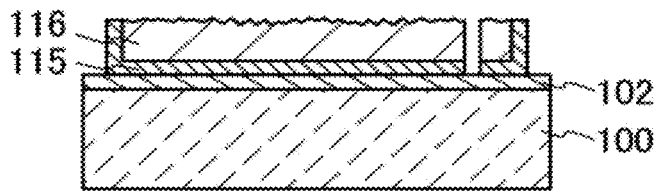
FIG. 8B
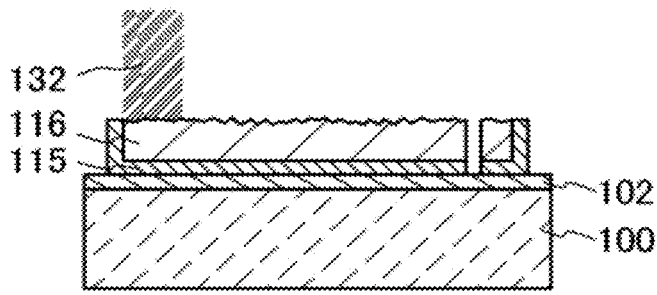
FIG. 8C
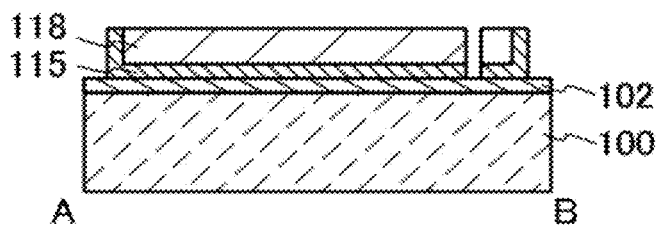
FIG. 8D
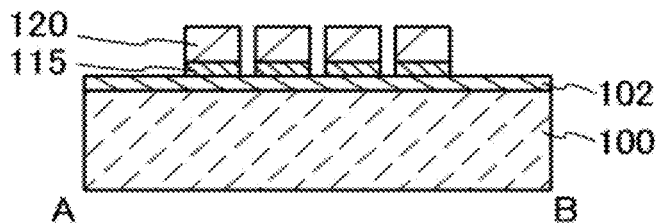

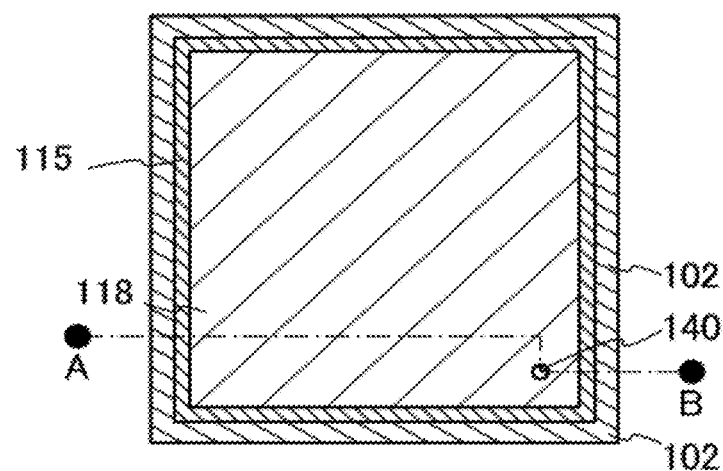
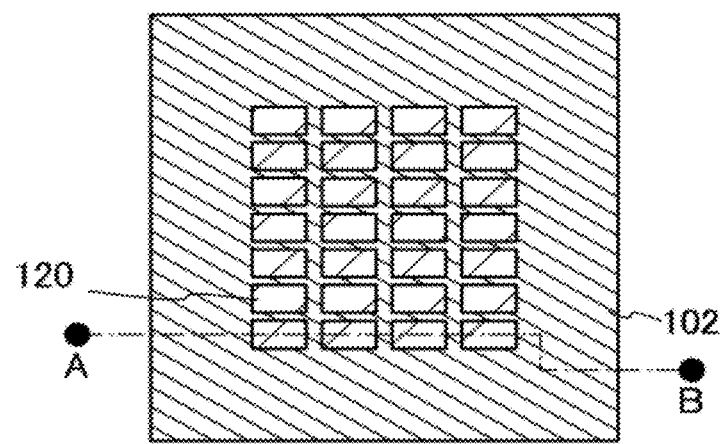

FIG. 11A
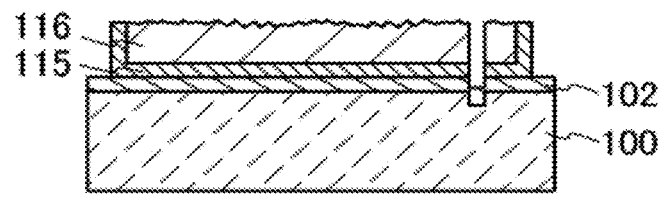
FIG. 11B
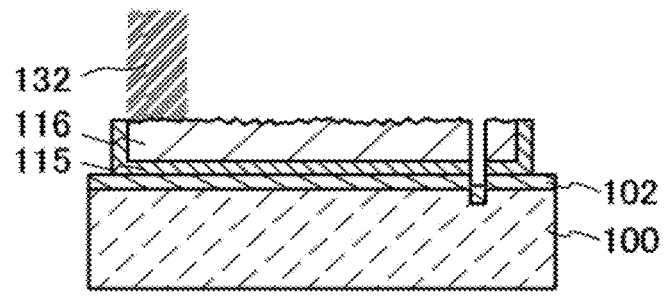
FIG. 11C
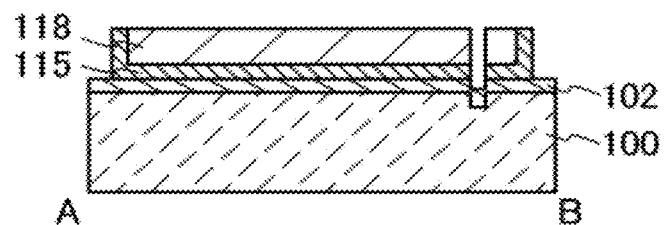
FIG. 11D
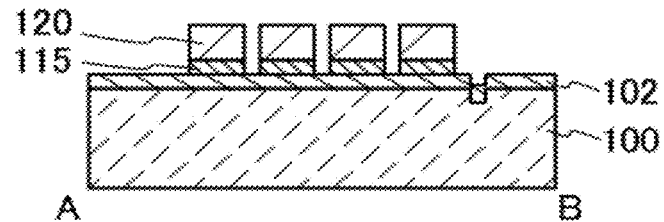

100 μm

100 μm

100 μm

METHOD FOR MANUFACTURING SOI SUBSTRATE AND SOI SUBSTRATE

BACKGROUND OF THE INVENTION

1. Field of the Invention

The present invention relates to a method for manufacturing a silicon-on-insulator (SOI) substrate, the SOI substrate, and a method for manufacturing a semiconductor device using the SOI substrate.

2. Description of the Related Art

In recent years, the use of a silicon-on-insulator (SOI) substrate where a thin single crystal semiconductor layer is provided over an insulating surface instead of a bulk silicon wafer has been investigated. Because parasitic capacitance generated by a drain of a transistor and a substrate can be reduced by use of an SOI substrate, SOI substrates are attracting attention as substrates which improve performance of semiconductor integrated circuits.

One of known methods for manufacturing SOI substrates is a Smart Cut (registered trademark) method (for example, see Reference 1). A summary of a method for manufacturing an SOI substrate with a Smart Cut method is described below. First, hydrogen ions are implanted into a silicon wafer with an ion implantation method; thus, a microbubble layer is formed at a predetermined depth from the surface. Next, the silicon wafer into which hydrogen ions are implanted is bonded to another silicon wafer with a silicon oxide film interposed therebetween. After that, through heat treatment, part of the silicon wafer into which hydrogen ions are implanted is separated as a thin film along the microbubble layer. Accordingly, a single crystal silicon film is formed over the other silicon wafer.

A method for forming a single crystal silicon layer over a base substrate made of glass by using such a Smart Cut method has been proposed (for example, see Reference 2). Glass substrates may have larger sizes and are less expensive than silicon wafers; thus, glass substrates are mainly used in manufacturing liquid crystal display devices or the like. By using a glass substrate as a base substrate, a large-sized inexpensive SOI substrate can be manufactured.

REFERENCE

Reference 1: Japanese Published Patent Application No. H05-211128
Reference 2: Japanese Published Patent Application No. 2005-252244

SUMMARY OF THE INVENTION

When a single crystal silicon layer is formed over a glass substrate with a Smart Cut method or the like, surface roughness of the silicon layer tends to be larger than that in the case where silicon wafers are bonded to each other to form an SOI substrate. Such surface roughness induces various failures in a later step, which causes reduction in yield of semiconductor elements or semiconductor devices.

In view of the above problem, an object of an embodiment of the disclosed invention is to suppress increase in surface roughness of a silicon layer when an SOI substrate is manufactured by bonding a base substrate such as a glass substrate and a single crystal semiconductor substrate that is a bond substrate to each other. Another object is to suppress increase in the roughness to increase the yield of manufacturing semiconductor devices.

According to an embodiment of the disclosed invention, a region where bonding is not performed is intentionally formed in part (particularly the peripheral portion) of an interface between the base substrate and a bond substrate in bonding the base substrate and the bond substrate to each other. More specific description will be given below.

An embodiment of the disclosed invention is a method for manufacturing an SOI substrate, including the steps of irradiating a bond substrate with accelerated ions to form an embrittled region in the bond substrate; forming an insulating layer over a surface of the bond substrate or a base substrate; forming a region where bonding is not performed in parts of the bond substrate and the base substrate while bonding the bond substrate and the base substrate to each other with the insulating layer interposed therebetween; and performing heat treatment to divide the bond substrate along the embrittled region so that a semiconductor layer is formed over the base substrate.

In the above, laser beam irradiation treatment is desirably performed on the semiconductor layer. The region where bonding is not performed is desirably formed by providing a recessed portion and/or a projected portion on the surface of the bond substrate or the base substrate. Alternatively, the region where bonding is not performed can be formed when the pressing pressure in bonding the base substrate and the bond substrate is controlled to be 20 N/cm$^2$ or more.

The region where bonding is not performed desirably has an area of 1.0 mm$^2$ or more. The region where bonding is not performed is desirably formed at a corner portion of the bond substrate. Bonding of the bond substrate and the base substrate is desirably initiated from the corner portion of the bond substrate. The temperature of the heat treatment is desirably 500° C. or less.

With the above method, an SOI substrate can be provided in which, for example, the number density of defects (in particular, defects each having a diameter of 1 μm or more) is 5.0 defects/cm$^2$ or less, preferably, 1.0 defect/cm$^2$ or less. Further, with the above method, an SOI substrate including a semiconductor layer having a surface whose P-V is 120 nm or less can be provided. Further, a semiconductor device can be manufactured using the SOI substrate and can be provided.

In general, an SOI substrate refers to a semiconductor substrate having a structure in which a silicon semiconductor layer is provided over an insulating surface; however, in this specification, an SOI substrate includes a semiconductor substrate having a structure in which a semiconductor layer is provided over an insulating surface. That is, a semiconductor layer used for an SOI substrate is not limited to a silicon semiconductor layer. In addition, in this specification, a semiconductor substrate refers to not only a substrate formed using only a semiconductor material but also a general substrate including a semiconductor material. That is, an SOI substrate is broadly included in a semiconductor substrate.

In this specification, the term "single crystal" means a crystal in which, when certain crystal axes are focused, the direction of the crystal axes is oriented in the same direction as that of the crystal axes in any portion of a sample. In this specification, the "single crystal" includes a crystal in which directions of crystal axes are uniform as described above even when including a crystal defect or a dangling bond.

The term "semiconductor device" in this specification refers to a general device that can operate by utilizing semiconductor characteristics, and a display device and an integrated circuit are included in the semiconductor device. The term "display device" in this specification includes a light emitting display device, a liquid crystal display device, and a display device using an electrophoretic element or the like. A light emitting device includes a light emitting element, and a liquid crystal display device includes a liquid crystal element. A light emitting element includes, in its scope, an element whose luminance is controlled by a current or a voltage, and specifically includes an inorganic electroluminescent (EL) element, an organic EL element, and the like.

In an embodiment of the disclosed invention, a region where bonding is not performed is intentionally formed in part (the peripheral portion) of a bonding interface. Accordingly, an SOI substrate having a semiconductor layer with reduced surface roughness can be provided. In addition, the yield of a semiconductor device using such an SOI substrate can be increased.

BRIEF DESCRIPTION OF THE DRAWINGS

FIGS. 1A to 1F are cross-sectional views illustrating an example of a method for manufacturing an SOI substrate and a semiconductor device.

FIGS. 4A to 4G are cross-sectional views illustrating an example of a method for manufacturing an SOI substrate and a semiconductor device.

FIGS. 8A to 8D are cross-sectional views illustrating an example of a method for manufacturing an SOI substrate and a semiconductor device.

FIGS. 9A and 9B are plan views illustrating an example of a method for manufacturing an SOI substrate and a semiconductor device.

FIGS. 11A to 11D are cross-sectional views illustrating an example of a method for manufacturing an SOI substrate and a semiconductor device.

DETAILED DESCRIPTION OF THE INVENTION

Figure 2A:
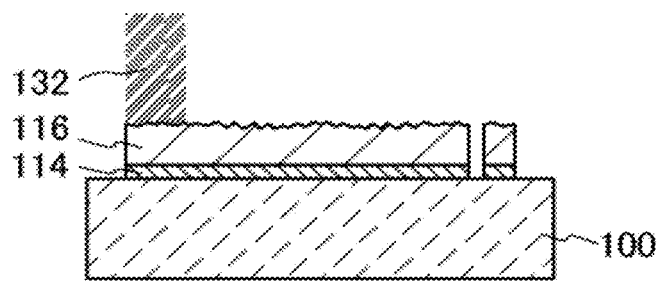
FIGS. 2A to 2C are cross-sectional views illustrating an example of a method for manufacturing an SOI substrate and a semiconductor device.

The embodiments and the example of the present invention are described in detail with reference to drawings. Note that the present invention is not limited to the description in the embodiments and the example below, and it is apparent to those skilled in the art that modes and details can be modified in various ways without departing from the spirit and scope of the present invention. In addition, structures according to different embodiments can be implemented in combination as appropriate. Note that in the structures of the present invention described below, like reference numerals refer to like portions or portions having similar functions, and the description thereof is omitted.

Embodiment 1

In this embodiment, an example of a method for manufacturing an SOI substrate will be described with reference to drawings. Specifically, the case of manufacturing an SOI substrate in which a single crystal semiconductor layer is provided over a base substrate will be described.

First, a base substrate 100 and a single crystal semiconductor substrate 110 are prepared (see FIGS. 1A and 1B).

As the base substrate 100, a substrate made from an insulator can be used. Specific examples thereof include: a variety of glass substrates used in the electronic industries, such as substrates formed with aluminosilicate glass, aluminoborosilicate glass, and barium borosilicate glass; a quartz substrate; a ceramic substrate; and a sapphire substrate. Note that when the above glass substrate contains barium oxide and boric acid so that the amount of barium oxide is larger than that of boric acid, more practical heat-resistant glass can be obtained. Therefore, in the case where a glass substrate needs to have heat resistance, it is preferable to use a glass substrate containing barium oxide and boric acid so that the amount of barium oxide is larger than that of boric acid. In this embodiment, the case of using a glass substrate as the base substrate 100 is described. When a glass substrate which can have a larger size and is inexpensive is used as the base substrate 100, cost reduction can be achieved.

Alternatively, a semiconductor substrate such as a single crystal silicon substrate or a single crystal germanium substrate may be used as the base substrate 100. In the case of using such a semiconductor substrate as the base substrate 100, the temperature limitation for heat treatment can be raised compared with the case of using a glass substrate or the like; thus, a high-quality SOI substrate is easily obtained. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that an embodiment of the disclosed invention is to suppress increase in surface roughness of a semiconductor layer, which arises from a difference in material between substrates to be bonded, or the like, and thus is effective in the case where materials or the like of substrates to be bonded are different. Even in the case where substrates made from the same material are bonded to each other, a sufficient advantageous effect can be obtained in terms of suppression of increase in surface roughness.

A surface of the base substrate 100 is preferably cleaned in advance. Specifically, the base substrate 100 is subjected to ultrasonic cleaning with a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. Through such cleaning treatment, for example, the surface planarity of the base substrate 100 can be improved and abrasive particles left on the surface of the base substrate 100 can be removed.

As the single crystal semiconductor substrate 110, for example, a single crystal semiconductor substrate formed with an element belonging to Group 14 of the periodic table, such as a single crystal silicon substrate, a single crystal germanium substrate, or a single crystal silicon germanium substrate, can be used. Alternatively, a compound semiconductor substrate of gallium arsenide, indium phosphide, or the like may be used. Typical commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to a circular shape and for example, a single crystal semiconductor substrate which is processed into a rectangular shape may be used. The single crystal semiconductor substrate 110 can be manufactured by a CZ method or a floating zone (FZ) method.

In view of removal of contaminants, it is preferable that a surface of the single crystal semiconductor substrate 110 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like. Alternatively, diluted hydrofluoric acid and ozone water may be discharged alternately to clean the surface of the single crystal semiconductor substrate 110.

Next, an embrittled region 112 is formed in the single crystal semiconductor substrate 110 at a predetermined depth from the surface, and then, the base substrate 100 and the single crystal semiconductor substrate 110 are bonded to each other with an insulating layer 114 interposed therebetween (see FIGS. 1C and 1D).

In this embodiment, a recessed portion 140 is formed in a region of a surface of the insulating layer 114, which corresponds to a peripheral portion of the single crystal semiconductor substrate 110, so that a region where the base substrate 100 and the single crystal semiconductor substrate 110 are not bonded to each other is intentionally formed (see FIG. 1C). The formation of the recessed 140 may allow the single crystal semiconductor substrate 110 to be exposed. By thus forming the region where bonding is not performed, a trigger for separation can be provided; therefore, increase in surface roughness of the formed single crystal semiconductor layer can be suppressed. Note that it is considered that formation of the region where bonding is not performed contributes to reduction in stress of a film.

Note that although the recessed portion 140 is formed in the insulating layer 114 in this embodiment, an embodiment of the disclosed invention is not construed as being limited thereto. A projected portion may be formed instead of the recessed portion. It is needless to say that a projected and recessed portion combining a recessed portion and a projected portion may alternatively be formed.

As a method for forming the recessed portion, patterning after the formation of the insulating layer 114, marking by laser beam irradiation or the like, marking using a glass pen, and the like can be given. As a method for forming the projected portion, patterning after the formation of the insulating layer 114, marking by laser beam irradiation or the like, marking using a glass pen, attaching a particle with an appropriate size to the surface of the insulating layer 114, and the like can be given. Note that there is the case where printing is performed using a laser marker, such as the case where a substrate (or a semiconductor device) is given an identification mark. When a recessed portion and/or a projected portion are/is formed utilizing such a method, a region where bonding is not performed can be formed without an increase in manufacturing cost, which is favorable.

The method for forming a region where bonding is not performed is not limited to formation of a recessed portion and/or a projected portion as long as the region can be formed. For example, by adjusting pressure (pressure applied to the base substrate and the single crystal semiconductor substrate) in bonding, a region where the base substrate 100 and the single crystal semiconductor substrate 110 are not bonded to each other can be formed. In that case, the pressure in bonding is desirably set to 20 N/cm$^2$ or higher. By setting the pressure in bonding to 20 N/cm$^2$ or higher, a region where bonding is not performed can be formed favorably.

Note that the area of the region where bonding is not performed is desirably set to 1.0 mm$^2$ or larger. Accordingly, increase in surface roughness of the formed semiconductor layer can be efficiently suppressed. Further, by setting the area of the region where bonding is not performed to 25 mm$^2$ or larger, increase in surface roughness of the formed semiconductor layer can be more efficiently suppressed.

Note that although the region where bonding is not performed is formed in a region corresponding to a peripheral region of the single crystal semiconductor substrate in this embodiment, the disclosed invention is not limited thereto. In the case of forming the region where bonding is not performed in the region corresponding to the peripheral region of the single crystal semiconductor substrate, it is preferably formed at a corner portion of the single crystal semiconductor substrate, for example. Thus, the region where bonding is not performed is provided at a corner portion and bonding is initiated from the corner portion, so that the effect of suppressing increase in surface roughness of the semiconductor layer can be improved.

The embrittled region 112 formed in the single crystal semiconductor substrate 110 at a predetermined depth from the surface can be formed by irradiating the single crystal semiconductor substrate 110 with ions of hydrogen or the like having kinetic energy caused by acceleration.

The depth at which the embrittled region 112 is formed can be adjusted by the kinetic energy, mass, charge, or incidence angle of the ions, or the like. The embrittled region 112 is formed at approximately the same depth as the average penetration depth of the ions. Therefore, the thickness of a single crystal semiconductor layer to be separated from the single crystal semiconductor substrate 110 can be adjusted with the depth at which the ions are added. For example, the average penetration depth may be adjusted such that the thickness of the single crystal semiconductor layer is approximately from 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In the apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion-doping apparatus is used to add hydrogen to the single crystal semiconductor substrate 110. A gas containing hydrogen is used as a source gas. As for ions used for the irradiation, the proportion of $H_3^+$ is preferably set high. Specifically, it is preferable that the proportion of $H_3^+$ be set to 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion doping apparatus, the number of steps can be reduced as compared to the case of performing irradiation of hydrogen and helium in separate steps, and increase in surface roughness of a single crystal semiconductor layer to be formed later can be further suppressed.

The insulating layer 114 can be formed with a single insulating layer of a silicon oxide film, a silicon oxynitride film, a silicon nitride film, or a silicon nitride oxide film or a stack of any of the above films. These films can be formed by a thermal oxidation method, a CVD method, a sputtering method, or the like.

In this specification, an oxynitride refers to a substance that contains oxygen and nitrogen so that the content (the number of atoms) of oxygen is higher (larger) than that of nitrogen. For example, a silicon oxynitride is a substance containing oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. A nitride oxide refers to a substance that contains oxygen and nitrogen so that the content (the number of atoms) of nitrogen is higher (larger) than that of oxygen. For example, a silicon nitride oxide is a substance containing oxygen, nitrogen, silicon, and hydrogen in ranges of 5 at. % to 30 at. %, 20 at. % to 55 at. %, 25 at. % to 35 at. %, and 10 at. % to 30 at. %, respectively. Note that the above ranges are obtained by measurement using Rutherford backscattering spectrometry (RBS) or hydrogen forward scattering (HFS). Moreover, the total of the percentages of the constituent elements does not exceed 100 at. %.

Bonding is performed as follows: the base substrate 100 and the single crystal semiconductor substrate 110 are disposed in close contact with each other with the insulating layer 114 interposed therebetween, and then a pressure of from 1 N/cm² to 500 N/cm² is applied to a portion of the base substrate 100 or the single crystal semiconductor substrate 110 (see FIG. 1D). When the pressure is applied, bonding between the base substrate 100 and the insulating layer 114 starts from the portion to which the pressure is applied, which forms a bonding spontaneously over the entire surface. This bonding step is performed under the action of the van der Waals force or hydrogen bonding and can be performed at room temperature.

Note that bonding is desirably initiated from the region where bonding is not performed. It is needless to say that a certain advantageous effect can be obtained even when bonding is initiated from a portion other than the region; however, when bonding is initiated from the region, increase in surface roughness can be more effectively suppressed.

Note that surface treatment is preferably performed on a bonding surface before the single crystal semiconductor substrate 110 and the base substrate 100 are bonded to each other. Surface treatment can improve the bonding strength at the bonding interface between the single crystal semiconductor substrate 110 and the base substrate 100.

As the surface treatment, wet treatment, dry treatment, and combination of wet treatment and dry treatment can be given. Different wet treatments or different dry treatments may be combined to be performed.

As the wet treatment, ozone treatment using ozone water (ozone water cleaning), megasonic cleaning, two-fluid cleaning (a method in which functional water such as pure water or hydrogenated water and a carrier gas such as nitrogen are sprayed together), and the like can be given. As the dry treatment, ultraviolet treatment, ozone treatment, plasma treatment, plasma treatment with bias application, radical treatment, and the like can be given. The above surface treatment on an object (a single crystal semiconductor substrate, an insulating layer formed over a single crystal semiconductor substrate, a support substrate, or an insulating layer formed over a support substrate) has an effect of improving hydrophilicity and cleanliness of the surface of the object. As a result, the boning strength between the substrates can be improved.

The wet treatment is effective for removal of macro dust and the like attached to the surface of the object. The dry treatment is effective for removal or decomposition of micro dust and the like such as an organic substance attached to the surface of the object. The case in which the dry treatment such as ultraviolet treatment is performed on the object and then the wet treatment such as cleaning is performed on the object is preferable because the surface of the object can be made clean and hydrophilic and generation of watermarks on the surface of the object can be suppressed.

As the dry treatment, it is preferable to perform surface treatment using ozone or oxygen in an active state, such as singlet oxygen. Ozone or oxygen in an active state, such as singlet oxygen, enables an organic substance attached to the surface of the object to be removed or decomposed effectively. Further, the treatment using ozone or oxygen in an active state, such as singlet oxygen, may be combined with treatment using ultraviolet light having wavelengths less than 200 nm, so that an organic substance attached to the surface of the object can be removed more effectively. Specific description thereof will be given below.

For example, surface treatment is performed on the object by irradiation with ultraviolet light in an atmosphere containing oxygen. In an atmosphere containing oxygen, irradiation with ultraviolet light having a wavelength of less than 200 nm and ultraviolet light having a wavelength of 200 nm or more is performed, whereby ozone can be generated and singlet oxygen can be generated. Irradiation with ultraviolet light having a wavelength of less than 180 nm is performed, whereby ozone can be generated and singlet oxygen can also be generated.

Examples of reactions which occur by irradiation with ultraviolet light having a wavelength of less than 200 nm and ultraviolet light having a wavelength of 200 nm or more in an atmosphere containing oxygen are described.

$$O_2 + h\nu(\lambda_1 \text{ nm}) \rightarrow O(^3P) + O(^3P) \tag{1}$$

$$O(^3P) + O_2 \rightarrow O_3 \tag{2}$$

$$O_3 + h\nu(\lambda_2 \text{ nm}) \rightarrow O(^1D) + O_2 \tag{3}$$

In the above reaction formula (1), irradiation with light (hν) having a wavelength ($\lambda_1$ nm) of less than 200 nm in an atmosphere containing oxygen ($O_2$) is performed to generate an oxygen atom (O($^3$P)) in a ground state. Next, in the reaction formula (2), an oxygen atom (O($^3$P)) in a ground state and oxygen (O$_2$) are reacted with each other to generate ozone (O$_3$). Then, in the reaction formula (3), irradiation with light having a wavelength ($\lambda_2$ nm) of 200 nm or more in an atmosphere containing generated ozone (O$_3$) is performed to generate singlet oxygen O($^1$D) in an excited state. In an atmosphere containing oxygen, irradiation with ultraviolet light having a wavelength of less than 200 nm is performed to generate ozone, and irradiation with ultraviolet light having a wavelength of 200 nm or more is performed to decompose ozone and generate singlet oxygen. Such surface treatment described above can be performed, for example, by irradiation with light from a low-pressure mercury lamp ($\lambda_1$=185 nm, $\lambda_2$=254 nm) in an atmosphere containing oxygen.

In addition, examples of reactions which occur by irradiation with light having a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 \pm h\nu(\lambda_3 \text{ nm}) \rightarrow O(^1D) + O_2 \quad (6)$$

In the above reaction formula (4), irradiation with light having a wavelength ($\lambda_3$ nm) of less than 180 nm in an atmosphere containing oxygen (O$_2$) is performed to generate singlet oxygen O($^1$D) in an excited state and an oxygen atom (O($^3$P)) in a ground state. Next, in the reaction formula (5), an oxygen atom (O($^3$P)) in a ground state and oxygen (O$_2$) are reacted with each other to generate ozone (O$_3$). In the reaction formula (6), irradiation with light having a wavelength ($\lambda_3$ nm) of less than 180 nm in an atmosphere containing generated ozone (O$_3$) is performed to generate singlet oxygen in an excited state and oxygen. In an atmosphere containing oxygen, irradiation with ultraviolet light having a wavelength of less than 180 nm is performed to generate ozone as well as to decompose ozone or oxygen and to generate singlet oxygen. Such surface treatment described above, for example, can be performed by irradiation with light from a Xe excimer UV lamp in an atmosphere containing oxygen.

Chemical bonding of an organic substance or the like attached to a surface of an object is cleaved with light having a wavelength of less than 200 nm, whereby the organic substance attached to the surface of the object, or the organic substance or the like whose chemical bonding is cleaved, can be removed by oxidative decomposition with ozone or singlet oxygen generated. By performing such surface treatment described above, the hydrophilicity and cleanliness of the surface of the object can be increased, and favorable bonding can be performed.

Note that heat treatment for increasing bonding strength may be performed after bonding. This heat treatment is performed at a temperature at which separation along the embrittled region 112 does not occur (for example, from room temperature to lower than 400° C.). Alternatively, the base substrate 100 and the insulating layer 114 may be bonded to each other while being heated at a temperature in this temperature range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Next, heat treatment is performed at a temperature of, for example, 400° C. or higher to cause separation of the single crystal semiconductor substrate 110 along the embrittled region 112, whereby a single crystal semiconductor layer 116 is provided over the base substrate 100 with the insulating layer 114 interposed therebetween (see FIGS. 1E and 1F).

By the heat treatment, the volume of the element is expanded in microvoids which are formed in the embrittled region 112 by the addition of the element, and the internal pressure of the microvoids is increased. By the increased pressure, a crack is generated in the embrittled region 112, and accordingly, the single crystal semiconductor substrate 110 is separated along the embrittled region 112. Since the insulating layer 114 is bonded to the base substrate 100, the single crystal semiconductor layer 116 (a layer between the surface of the single crystal semiconductor substrate 110 and the embrittled region), which is separated from the single crystal semiconductor substrate 110, and the insulating layer 114 remain over the base substrate 100. Note that bonding is not performed at the recessed portion 140, so that the single crystal semiconductor layer 116 is not formed in a region of the base substrate 100, which corresponds to the recessed portion 140. Such a region serves as a trigger for separation and thus, increase in surface roughness of the single crystal semiconductor layer 116 can be suppressed.

Note that the temperature for heat treatment in the separation is desirably as low as possible. This is because the lower the temperature in the separation is, the more surface roughness of the single crystal semiconductor layer 116 can be decreased. Specifically, it is efficient that the temperature for heat treatment in the separation is controlled from 300° C. to 600° C., preferably from 400° C. to 500° C. Note that the inventor found in this study that formation of the region where bonding is not performed enables the reduction of the substrate temperature at which the separation occurs. Namely, the inventor found that the substrate temperature required for the separation can be decreased. For example, a temperature higher than or equal to 500° C. is needed in separation when the region where bonding is not performed is not formed, whereas separation can be performed under the temperature of 500° C. or less when the region where bonding is not performed is formed. Note that the above temperature condition is merely an example, and an embodiment of the disclosed invention should not be construed as being limited to this example.

In addition, it was also found that formation of the region where bonding is not performed resulted in the reduction of the variation of the temperature (separating temperature) at which the separation of the base substrate from the semiconductor substrate occurs. For example, the separation temperatures of four samples each of which was provided with a region where bonding is not performed were within the range of approximately ±1° C. Therefore, the formation of the region where bonding is not performed contributes to the reduction of the variation in the separation process.

Figure 2B:
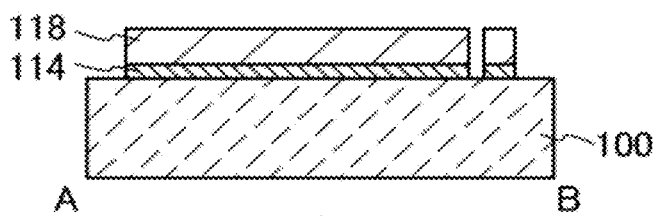
Figure 3A:
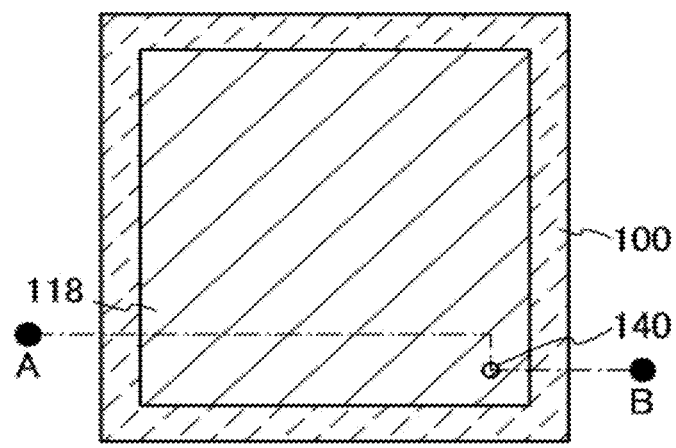
FIGS. 3A and 3B are plan views illustrating an example of a method for manufacturing an SOI substrate and a semiconductor device.

Next, a surface of the single crystal semiconductor layer 116 is irradiated with a laser beam 132 to form the single crystal semiconductor layer 118 with improved surface planarity and a reduced number of defects (see FIGS. 2A and 2B and FIG. 3A). FIG. 2B corresponds to a cross section taken along A-B in FIG. 3A.

Note that it is preferable that the single crystal semiconductor layer 116 be subjected to partial melting by irradiation with the laser beam 132. This is because, if the single crystal semiconductor layer 116 is completely melted, it is microcrystallized due to disordered nucleation from a liquid phase, so that the crystallinity thereof decreases. On the other hand, if the single crystal semiconductor layer 116 is partially melted, crystal growth can proceed from a non-melted solid phase portion. Therefore, crystal quality can be improved as compared to the case where the single crystal semiconductor layer 116 is completely melted. In addition, incorporation of oxygen, nitrogen, or the like from the insulating layer 114 can be suppressed. Note that "partial melting" in the above description means melting of the single crystal semiconductor layer 116 with laser beam irradiation to a depth smaller than that of an interface on the insulating layer 114 side (i.e., smaller than the thickness of the single crystal semiconductor layer 116). In other words, it refers to a state in which the upper portion of the single crystal semiconductor layer 116 is melted to be in a liquid phase whereas the lower portion is not melted and remains in a solid phase. Note that "complete melting" means that the single crystal semiconductor layer 116 is melted to the interface with the insulating layer 114 and comes to be in a liquid state.

For the laser beam irradiation, a pulsed laser is preferably used. This is because high energy can be obtained and thus a partially melted state can easily be produced. The oscillation frequency is preferably, but not limited to, from 1 Hz to 10 MHz. Examples of the pulsed laser include an Ar laser, a Kr, laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. Note that a continuous-wave laser may be used if it can cause partial melting. Examples of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

The wavelength of the laser beam 132 needs to be selected so that the laser beam 132 is absorbed by the single crystal semiconductor layer 116. The wavelength may be determined in consideration of the skin depth of the laser beam, and the like. For example, the wavelength can be set in the range of from 250 nm to 700 nm. The energy density of the laser beam 132 can be determined in consideration of the wavelength of the laser beam 132, the skin depth of the laser beam, the thickness of the single crystal semiconductor layer 116, and the like. The energy density of the laser beam 132 may be set in the range of from 300 mJ/cm$^2$ to 800 mJ/cm$^2$, for example. Note that the above range of the energy density is an example when a XeCl excimer laser (wavelength: 308 nm) is used as the pulsed laser.

The irradiation with the laser beam 132 can be performed in an atmosphere containing oxygen such as an air atmosphere or in an inert atmosphere such as a nitrogen atmosphere or an argon atmosphere. In order to perform irradiation with the laser beam 132 in an inert atmosphere, the irradiation with the laser beam 132 may be performed in an airtight chamber while the atmosphere in the chamber is controlled. In the case where a chamber is not used, an inert atmosphere can be obtained by blowing an inert gas such as a nitrogen gas to the surface which is irradiated with the laser beam 132.

Note that irradiation with the laser beam 132 in an inert atmosphere such as nitrogen can improve the planarity of the single crystal semiconductor layer 118 more effectively than that in an air atmosphere. In addition, in an inert atmosphere, generation of cracks and ridges can be suppressed more effectively than in an air atmosphere, and the applicable energy density range for the laser beam 132 is wider. Note that irradiation with the laser beam 132 may be performed in a reduced-pressure atmosphere. When irradiation with the laser beam 132 is performed in a reduced-pressure atmosphere, the same effects as those obtained by the irradiation in an inert atmosphere can be obtained.

Although the irradiation treatment with the laser beam 132 is performed just after the heat treatment for separation of the single crystal semiconductor layer 116 in this embodiment, an embodiment of the disclosed invention is not construed as being limited to this. Etching treatment may be performed after the heat treatment for separation of the single crystal semiconductor layer 116 to remove a region having many defects in the surface of the single crystal semiconductor layer 116, and then the irradiation treatment with the laser beam 132 may be performed. Alternatively, after improving planarity of the surface of the single crystal semiconductor layer 116 by etching treatment and the like, the irradiation treatment with the laser beam 132 may be performed. As the above etching treatment, either wet etching or dry etching may be employed.

Although not described in this embodiment, after the irradiation with the laser beam 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having a semiconductor layer with reduced surface roughness can be obtained (see FIG. 2B and FIG. 3A).

In this embodiment, a surface of the single crystal semiconductor layer 116 is irradiated with the laser beam 132 to form the single crystal semiconductor layer 118 with improved surface planarity and a reduced number of defects. On the other hand, in the case where the disclosed invention is not applied, since the surface of the single crystal semiconductor layer 116 is rough before irradiation with the laser beam 132, the quality of the single crystal semiconductor layer 118 tends to be further decreased by being irradiated with the laser beam 132. For example, in the case where the single crystal semiconductor layer 116 has a minute defect (such as a local crack of a film), this defect tends to be enlarged by irradiation with the laser beam 132. This is considered to be due to the fact that a semiconductor in a peripheral region of the minute defect (a region where the single crystal semiconductor layer 116 is thin) is melted by irradiation with the laser beam 132 and moves by surface tension or the like.

Thus, in the case where the surface of the single crystal semiconductor layer 116 is rough, a defect due to the surface roughness tends to be caused; therefore, it is important to suppress the increase in surface roughness of the single crystal semiconductor layer 116. In particular, in the case of employing irradiation with the laser beam 132, a method for forming a region where bonding is not performed, which is described in this embodiment, is a significantly effective solving means.

Figure 2C:
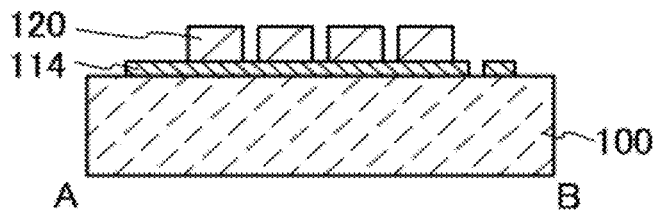
Figure 3B:
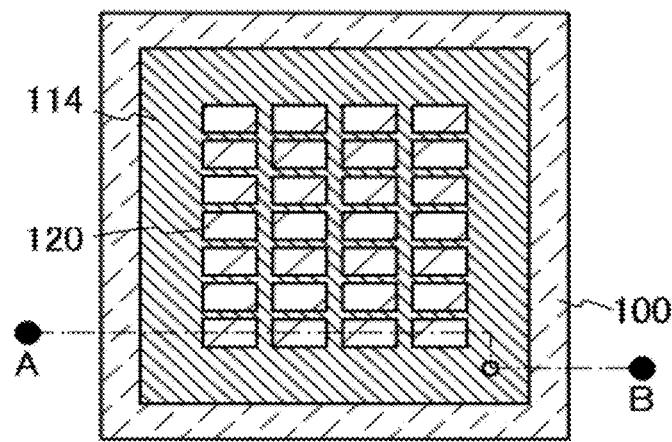

After the above steps, the single crystal semiconductor layer 118 of the SOI substrate may be patterned into an island-shaped semiconductor layer 120. In the patterning, the single crystal semiconductor layer 118 in the region corresponding to the above peripheral portion (the vicinity of the region where the recessed portion 140 is formed) is removed (see FIG. 2C and FIG. 3B). FIG. 2C corresponds to a cross section taken along A-B in FIG. 3B. The removal of the region corresponding to the peripheral portion is due to the high probability of peeling of the single crystal semiconductor layer 118 because of the insufficient bonding strength in this region. Note that the edge of the surface of the single crystal semiconductor substrate has a shape having a curvature (called edge roll-off) resulting from the surface polishing treatment, so that the region lacks in bonding strength. It is needless to say that the single crystal semiconductor layer 118 is not necessarily removed in the region corresponding to the peripheral portion.

Although the recessed portion is provided at a portion of the corner portion of the single crystal semiconductor layer in this embodiment (see FIG. 3A or the like), an embodiment of the disclosed invention is not limited thereto. The number, the position, or the like of the region where bonding is not performed may be set as appropriate. Further, in considering the improvement of the yield of manufacturing semiconductor devices, it is desirable to form the region where bonding is not performed in the region to be removed later (see FIG. 3B).

Note that the structure described in this embodiment can be used in appropriate combination with any of structures described in the other embodiments and example.

Embodiment 2

In this embodiment, anther example of a method for manufacturing an SOI substrate will be described with reference to drawings.

First, the base substrate 100 and the single crystal semiconductor substrate 110 are prepared (see FIGS. 4A and 4C). The details of the base substrate 100 and the single crystal semiconductor substrate 110, for which the above embodiment can be referred to, are omitted here.

A recessed portion 142 is formed at a region of a surface of the base substrate 100, which corresponds to a peripheral portion of the single crystal semiconductor substrate 110 (see FIG. 4B). Here, the recessed portion 142 is formed in the surface of the base substrate 100; however, the method for forming a region where the base substrate 100 and the single crystal semiconductor substrate 110 are not bonded to each other is not limited to formation of the recessed portion as long as the region can be formed. A projected portion or a projected and recessed portion may be formed instead of the recessed portion. For the method for forming the region where bonding is not performed, the above embodiment can be referred to.

The embrittled region 112 is formed at a predetermined depth from the surface of the single crystal semiconductor substrate 110, and the base substrate 100 and the single crystal semiconductor substrate 110 are bonded to each other with the insulating layer 114 interposed therebetween (see FIGS. 4D and 4E).

The embrittled region 112 can be formed by irradiating the single crystal semiconductor substrate 110 with ions of hydrogen or the like having kinetic energy caused by acceleration. The above embodiment may be referred to for details.

Bonding is performed as follows: the base substrate 100 and the single crystal semiconductor substrate 110 are disposed in close contact with each other with the insulating layer 114 interposed therebetween, and then a pressure of from 1 N/cm$^2$ to 500 N/cm$^2$ is applied to a portion of the base substrate 100 or the single crystal semiconductor substrate 110. When the pressure is applied, bonding between the base substrate 100 and the insulating layer 114 starts from the portion to which the pressure is applied, which forms a bonding spontaneously over the entire surface. This bonding step is performed under the action of the van der Waals force or hydrogen bonding and can be performed at room temperature.

Note that surface treatment is preferably performed on a bonding surface before the single crystal semiconductor substrate 110 and the base substrate 100 are bonded to each other. Surface treatment can improve the bonding strength at the bonding interface between the single crystal semiconductor substrate 110 and the base substrate 100. The above embodiment can be referred to for details of the surface treatment.

Note that heat treatment for increasing bonding strength may be performed after bonding. This heat treatment is performed at a temperature at which separation along the embrittled region 112 does not occur (for example, from room temperature to lower than 400° C.). The base substrate 100 and the insulating layer 114 may be bonded to each other while being heated at a temperature in this temperature range. The heat treatment can be performed using a diffusion furnace, a heating furnace such as a resistance heating furnace, a rapid thermal annealing (RTA) apparatus, a microwave heating apparatus, or the like.

Next, heat treatment is performed at a temperature of, for example, 400° C. or higher to cause separation of the single crystal semiconductor substrate 110 at the embrittled region 112, whereby the single crystal semiconductor layer 116 is provided over the base substrate 100 with the insulating layer 114 interposed therebetween (see FIGS. 4F and 4G).

By the heat treatment, the volume of the element is expanded in microvoids which are formed in the embrittled region 112 by the addition of the element, and the internal pressure of the microvoids is increased. By the increased pressure, a crack is generated in the embrittled region 112, and accordingly, the single crystal semiconductor substrate 110 is separated along the embrittled region 112. Since the insulating layer 114 is bonded to the base substrate 100, the single crystal semiconductor layer 116 (a layer between the surface of the single crystal semiconductor substrate 110 and the embrittled region), which is separated from the single crystal semiconductor substrate 110, and the insulating layer 114 remain over the base substrate 100. Note that bonding is not performed at the recessed portion 140, so that the single crystal semiconductor layer 116 is not formed in a region of the base substrate 100, which corresponds to the recessed portion 140. Such a region serves as a trigger for separation and thus, surface roughness of the single crystal semiconductor layer 116 can be suppressed.

Figure 5A:
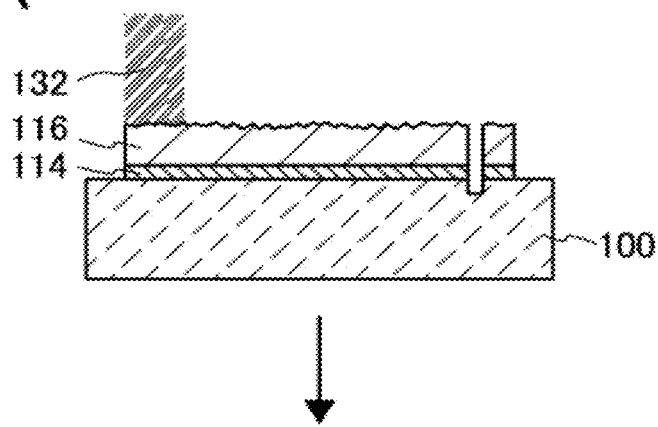
FIGS. 5A to 5C are cross-sectional views illustrating an example of a method for manufacturing an SOI substrate and a semiconductor device.
Figure 5B:
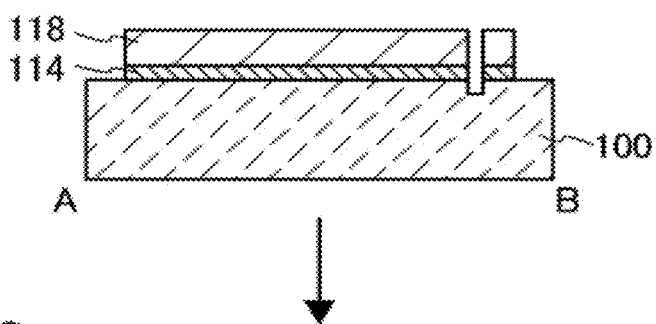
Figure 6A:
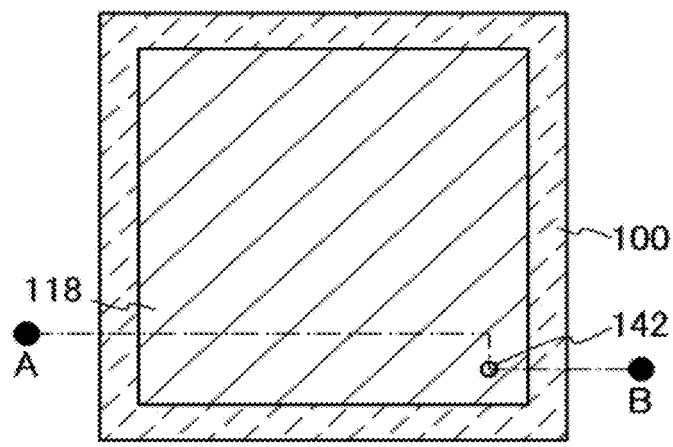
FIGS. 6A and 6B are plan views illustrating an example of a method for manufacturing an SOI substrate and a semiconductor device.

Next, a surface of the single crystal semiconductor layer 116 is irradiated with the laser beam 132 to form the single crystal semiconductor layer 118 with improved surface planarity and a reduced number of defects (see FIGS. 5A and 5B and FIG. 6A). FIG. 5B corresponds to a cross section taken along A-B in FIG. 6A. The above embodiment can be referred to for details of the irradiation with the laser beam 132.

Although the irradiation treatment with the laser beam 132 is performed just after the heat treatment for separation of the single crystal semiconductor layer 116 in this embodiment, an embodiment of the disclosed invention is not construed as being limited to this. Etching treatment may be performed after the heat treatment for separation of the single crystal semiconductor layer 116 to remove a region having many defects in the surface of the single crystal semiconductor layer 116, and then the irradiation treatment with the laser beam 132 may be performed. Alternatively, after improving planarity of the surface of the single crystal semiconductor layer 116 by etching treatment and the like, the irradiation treatment with the laser beam 132 may be performed. As the above etching treatment, either wet etching or dry etching may be employed.

Although not described in this embodiment, after the irradiation with the laser beam 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having a semiconductor layer with reduced surface roughness can be obtained (see FIG. 5B and FIG. 6A).

Figure 5C:
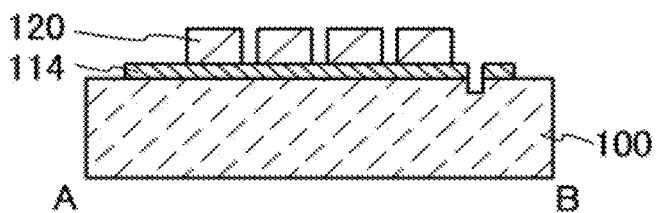
Figure 6B:
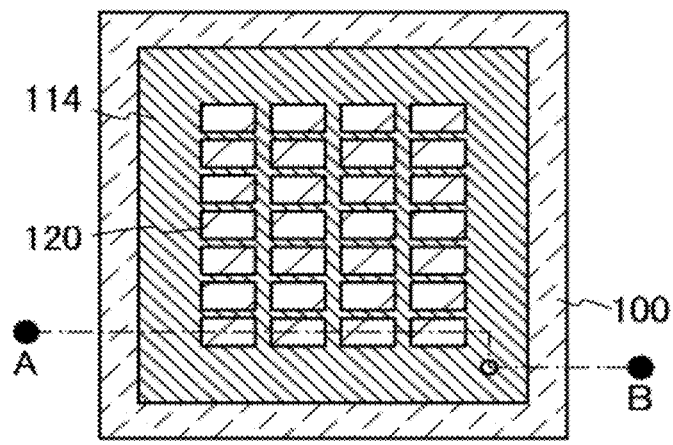

After the above steps, the single crystal semiconductor layer 118 of the SOI substrate may be patterned into the island-shaped semiconductor layer 120. In the patterning, the single crystal semiconductor layer 118 in the region corresponding to the above peripheral portion (the vicinity of the region where the recessed portion 140 is formed) is removed (see FIG. 5C and FIG. 6B). FIG. 5C corresponds to a cross section taken along A-B in FIG. 6B. The removal of the region corresponding to the peripheral portion is due to the high probability of peeling of the single crystal semiconductor layer 118 because of the insufficient bonding strength in this region. It is needless to say that the single crystal semiconductor layer 118 is not necessarily removed in the region corresponding to the peripheral portion.

Although the recessed portion is provided at a portion of the corner portion of the single crystal semiconductor layer in this embodiment (see FIG. 6A or the like), an embodiment of the disclosed invention is not limited thereto. The number, the position, or the like of the region where bonding is not performed may be set as appropriate. Further, in considering the improvement of the yield of manufacturing semiconductor devices, it is desirable to form the region where bonding is not performed in the region to be removed later (see FIG. 6B).

Note that the structure described in this embodiment can be used in appropriate combination with any of structures described in the other embodiments and example.

Embodiment 3

In this embodiment, another example of a method for manufacturing an SOI substrate will be described with reference to drawings.

Figure 7A:
FIGS. 7A to 7G are cross-sectional views illustrating an example of a method for manufacturing an SOI substrate and a semiconductor device.
Figure 7B:
Figure 7C:

First, the base substrate 100 and the single crystal semiconductor substrate 110 are prepared (see FIGS. 7A and 7C). Details of the base substrate 100 and the single crystal semiconductor substrate 110 are omitted here because the above embodiment can be referred to.

A nitrogen-containing layer 102 (a layer including an insulating film containing nitrogen, such as a silicon nitride ($SiN_x$) film or a silicon nitride oxide ($SiN_xO_y$ (x>y)) film) is formed over a surface of the base substrate 100 (see FIG. 7B).

The nitrogen-containing layer 102 formed in this embodiment functions as a layer for bonding a single crystal semiconductor layer (as a bonding layer) in a later step. The nitrogen-containing layer 102 also functions as a barrier layer for preventing an impurity contained in the base substrate, such as sodium (Na), from diffusing into the single crystal semiconductor layer.

As described above, the nitrogen-containing layer 102 is used as a bonding layer in this embodiment; thus, the nitrogen-containing layer 102 is preferably formed such that its surface has a predetermined degree of planarity. Specifically, the nitrogen-containing layer 102 is formed such that it has an average surface roughness ($R_a$) of 0.5 nm or less and a root-mean-square surface roughness ($R_{ms}$) of 0.60 nm or less, preferably, an average surface roughness of 0.35 nm or less and a root-mean-square surface roughness of 0.45 nm or less. The thickness is in the range of from 10 nm to 200 nm, preferably, from 50 nm to 100 nm. With such a high degree of surface planarity, defective bonding of a single crystal semiconductor layer can be prevented.

Figure 7D:

An oxide film 115 is formed over a surface of the single crystal semiconductor substrate 110 (see FIG. 7D). In view of removal of contaminants, it is preferable that a surface of the single crystal semiconductor substrate 110 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like before forming the oxide film 115. Alternatively, diluted hydrofluoric acid and ozone water may be discharged alternately to clean the surface of the single crystal semiconductor substrate 110.

The oxide film 115 can be formed with, for example, a single layer of a silicon oxide film, a silicon oxynitride film, or the like or a stack of any of the above films. As a method for forming the oxide film 115, a thermal oxidation method, a CVD method, a sputtering method, or the like can be used. When the oxide film 115 is formed with a CVD method, a silicon oxide film is preferably formed using organosilane such as tetraethoxysilane (abbreviation: TEOS) (chemical formula: $Si(OC_2H_5)_4$).

In this embodiment, the oxide film 115 (here, a $SiO_x$ film) is formed by performing thermal oxidation treatment of the single crystal semiconductor substrate 110. The thermal oxidation treatment is preferably performed in an oxidizing atmosphere to which halogen is added.

For example, thermal oxidation treatment of the single crystal semiconductor substrate 110 is performed in an oxidizing atmosphere to which hydrogen chloride is added, whereby the oxide film 115 can be formed through chlorine oxidation. In this case, the oxide film 115 contains chlorine atoms.

Chlorine atoms contained in the oxide film 115 cause distortion in the oxide film 115. As a result, the diffusion rate of water in the oxide film 115 is increased. In other words, when water is attached to the surface of the oxide film 115, the water can be quickly absorbed into the oxide film 115 and diffused therein. Thus, defective bonding due to moisture can be suppressed.

Further, with the chlorine atoms contained in the oxide film 115, heavy metal (such as Fe, Cr, Ni, or Mo) that is an extrinsic impurity can be trapped, so that contamination of the single crystal semiconductor substrate 110 can be prevented. Moreover, after the bonding to the base substrate, impurities from the base substrate, such as Na, can be fixed, so that contamination of the single crystal semiconductor substrate 110 can be prevented.

Note that the halogen atoms contained in the oxide film 115 are not limited to chlorine atoms. Fluorine atoms may be contained in the oxide film 115. As a method for fluorine oxidation of the surface of the single crystal semiconductor substrate 110, a method in which the single crystal semiconductor substrate 110 is soaked in an HF solution and then subjected to thermal oxidation treatment in an oxidizing atmosphere, a method in which thermal oxidation treatment is performed in an oxidizing atmosphere to which $NF_3$ is added, or the like can be employed.

Next, the single crystal semiconductor substrate 110 is irradiated with ions accelerated by an electrical field, whereby the embrittled region 112, where the crystal structure is damaged, is formed in the single crystal semiconductor substrate 110 at a predetermined depth (see FIG. 7D). The above embodiment may be referred to for details. Note that there is a possibility that a heavy metal is added to the single crystal semiconductor substrate 110 when the embrittled region 112 is formed using the ion-doping apparatus; however, the ion irradiation is performed through the oxide film 115 containing halogen atoms, so that contamination of the single crystal semiconductor substrate 110 due to the heavy metal can be prevented.

Figure 7E:

Next, the recessed portion 140 is formed at a region of a surface of the oxide film 115, which corresponds to a peripheral portion of the single crystal semiconductor substrate 110, so that a region where the base substrate 100 and the single crystal semiconductor substrate 110 are not bonded to each other is intentionally formed (see FIG. 7E). The formation of the recessed 140 may allow the single crystal semiconductor substrate 110 to be exposed. Such a region serves as a trigger for separation and thus, increase in surface roughness of a single crystal semiconductor layer can be suppressed.

In this embodiment, the recessed portion 140 is formed in the oxide film 115; however, an embodiment of the disclosed invention is not construed as being limited to this. A projected portion or a projected and recessed portion may be formed instead of the recessed portion. For the method for forming the region where bonding is not performed, the above embodiment can be referred to.

Figure 7F:
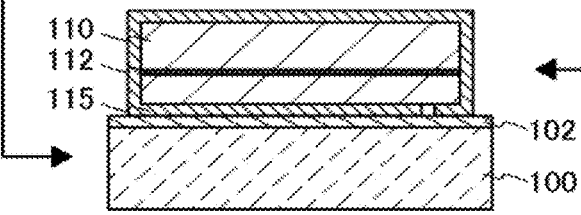

Next, a surface of the base substrate 100 and a surface of the single crystal semiconductor substrate 110 are disposed to face each other, and a surface of the nitrogen-containing layer 102 and a surface of the oxide film 115 are bonded to each other (see FIG. 7F).

Here, after the base substrate 100 and the single crystal semiconductor substrate 110 are disposed in close contact with each other with the nitrogen-containing layer 102 and the oxide film 115 interposed therebetween, a pressure of from 1 N/cm$^2$ to 500 N/cm$^2$ is applied to one portion of the base substrate 100 or the single crystal semiconductor substrate 110. Then, the bonding of the nitrogen-containing layer 102 and the oxide film 115 is initiated from the pressure-applied portion, and the bonding spontaneously proceeds in the entire area. This bonding step is performed under the action of the van der Waals force or hydrogen bonding and can be performed at room temperature.

Note that before the base substrate 100 and the single crystal semiconductor substrate 110 are bonded to each other, the oxide film 115 formed over the single crystal semiconductor substrate 110 and the nitrogen-containing layer 102 formed over the base substrate 100 are preferably subjected to surface treatment. For the details of the surface treatment, the above embodiment can also be referred to.

After the nitrogen-containing layer 102 and the oxide film 115 are bonded to each other, heat treatment for increasing the bonding strength is preferably performed. This heat treatment is performed at a temperature at which separation along the embrittled region 112 does not occur (for example, from room temperature to lower than 400° C.). Alternatively, the nitrogen-containing layer 102 and the oxide film 115 may be bonded to each other while being heated at a temperature within this range. The heat treatment can be performed using a diffusion furnace, a heating furnace such as a resistance heating furnace, a rapid thermal annealing (RTA) apparatus, a microwave heating apparatus, or the like.

Figure 7G:
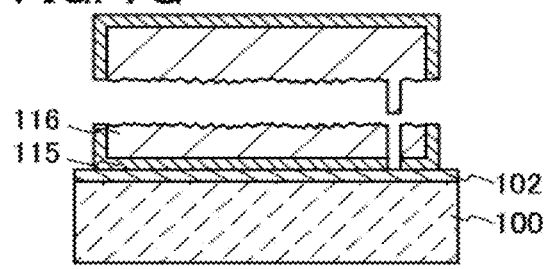

Next, the single crystal semiconductor substrate 110 is separated along the embrittled region 112 by performing the heat treatment, so that the single crystal semiconductor layer 116 is formed over the base substrate 100 with the nitrogen-containing layer 102 and the oxide film 115 interposed therebetween (see FIG. 7G and FIG. 8A). For the details of the heat treatment, the above embodiment can be referred to. Here, since bonding is not performed at the recessed portion 140, the single crystal semiconductor layer 116 is not formed in a region of the base substrate 100, which corresponds to the recessed portion 140. Such a region serves as a trigger for separation and thus, increase in surface roughness of the single crystal semiconductor layer 116 can be suppressed.

Next, a surface of the single crystal semiconductor layer 116 is irradiated with the laser beam 132 to form the single crystal semiconductor layer 118 with improved surface planarity and a reduced number of defects (see FIGS. 8B and 8C and FIG. 9A). FIG. 8C corresponds to a cross section taken along A-B in FIG. 9A. The above embodiment can be referred to for details.

Although the irradiation treatment with the laser beam 132 is performed just after the heat treatment for separation of the single crystal semiconductor layer 116 in this embodiment, an embodiment of the disclosed invention is not construed as being limited to this. Etching treatment may be performed after the heat treatment for separation of the single crystal semiconductor layer 116 to remove a region having many defects in the surface of the single crystal semiconductor layer 116, and then the irradiation treatment with the laser beam 132 may be performed. Alternatively, after improving planarity of the surface of the single crystal semiconductor layer 116 by etching treatment and the like, the irradiation treatment with the laser beam 132 may be performed. As the above etching treatment, either wet etching or dry etching may be employed.

Although not described in this embodiment, after the irradiation with the laser beam 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having a semiconductor layer with reduced surface roughness can be obtained (see FIG. 8C and FIG. 9A).

After the above steps, the single crystal semiconductor layer 118 of the SOI substrate may be patterned into the island-shaped semiconductor layer 120. In the patterning, the single crystal semiconductor layer 118 in the region corresponding to the above peripheral portion (the vicinity of the region where the recessed portion 140 is formed) is removed (see FIG. 8D and FIG. 9B). FIG. 8D corresponds to a cross section taken along A-B in FIG. 9B. The removal of the region corresponding to the peripheral portion is due to the high probability of peeling of the single crystal semiconductor layer 118 because of the insufficient bonding strength in this region. Note that the edge of the surface of the single crystal semiconductor substrate has a shape having a curvature (called edge roll-off) resulting from the surface polishing treatment, so that the region lacks in bonding strength. It is needless to say that the single crystal semiconductor layer 118 is not necessarily removed in the region corresponding to the peripheral portion.

Although the recessed portion is provided at a portion of the corner portion of the single crystal semiconductor layer in this embodiment (see FIG. 9A or the like), an embodiment of the disclosed invention is not limited thereto. The number, the position, or the like of the region where bonding is not performed may be set as appropriate. Further, in considering the improvement of the yield of manufacturing semiconductor devices, it is desirable to form the region where bonding is not performed in the region to be removed later (see FIG. 9B).

Note that the structure described in this embodiment can be used in appropriate combination with any of structures described in the other embodiments and example.

Embodiment 4

In this embodiment, anther example of a method for manufacturing an SOI substrate will be described with reference to drawings.

Figure 10A:
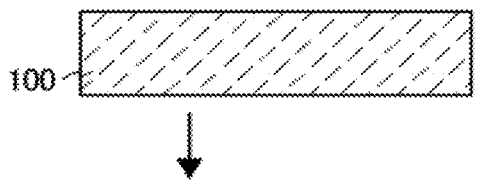
FIGS. 10A to 10H are cross-sectional views illustrating an example of a method for manufacturing an SOI substrate and a semiconductor device.
Figure 10D:
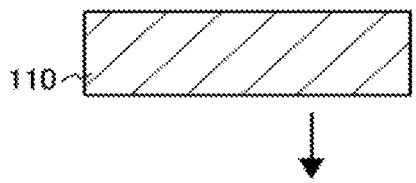

First, the base substrate 100 and the single crystal semiconductor substrate 110 are prepared (see FIGS. 10A and 10D). For details of the base substrate 100 and the single crystal semiconductor substrate 110, the above embodiment can be referred to.

Figure 10B:
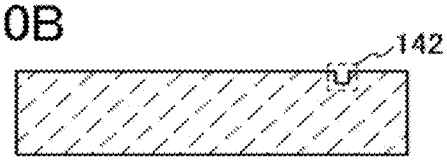

The recessed portion 142 is formed at a region of a surface of the base substrate 100, which corresponds to a peripheral portion of the single crystal semiconductor substrate 110 (see FIG. 10B). Here, the recessed portion 142 is formed in the surface of the base substrate 100; however, the method for forming a region where the base substrate 100 and the single crystal semiconductor substrate 110 are not bonded to each other is not limited to formation of the recessed portion as long as the region can be formed. A projected portion or a projected and recessed portion may be formed instead of the recessed portion. For the method for forming the region where bonding is not performed, the above embodiment can be referred to.

Figure 10E:
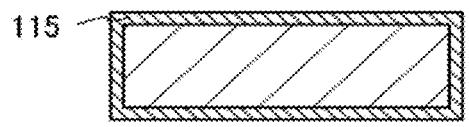
Figure 10C:
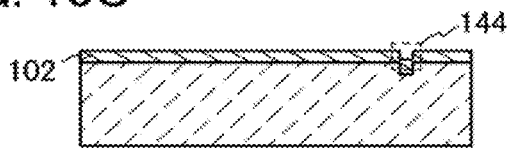

Then, the nitrogen-containing layer 102 (a layer including an insulating film containing nitrogen, such as a silicon nitride ($SiN_x$) film or a silicon nitride oxide ($SiN_xO_y$ (x>y)) film is formed over a surface of the base substrate 100 (see FIG. 10C). The recessed portion 142 is formed in the base substrate 100, and thus the recessed portion 144 is formed in the nitrogen-containing layer 102. The recessed portion 144 serves as a trigger for separation and thus, increase in surface roughness of the single crystal semiconductor layer 116 can be suppressed.

The nitrogen-containing layer 102 formed in this embodiment functions as a layer for bonding a single crystal semiconductor layer (as a bonding layer) in a later step. The nitrogen-containing layer 102 also functions as a barrier layer for preventing an impurity contained in the base substrate, such as sodium (Na), from diffusing into a single crystal semiconductor layer. The above embodiment may be referred to for details of the nitrogen-containing layer 102.

The oxide film 115 is formed over a surface of the single crystal semiconductor substrate 110 (see FIG. 10E). The above embodiment can also be referred to for details of the oxide film 115.

Figure 10F:
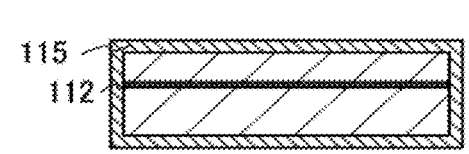

Next, the single crystal semiconductor substrate 110 is irradiated with ions accelerated by an electrical field, whereby the embrittled region 112, where the crystal structure is damaged, is formed in the single crystal semiconductor substrate 110 at a predetermined depth (see FIG. 10F). The above embodiment may be referred to for details. Note that there is a possibility that a heavy metal is added to the single crystal semiconductor substrate 110 when the embrittled region 112 is formed using the ion-doping apparatus; however, the ion irradiation is performed through the oxide film 115 containing halogen atoms, so that contamination of the single crystal semiconductor substrate 110 due to the heavy metal can be prevented.

Figure 10G:
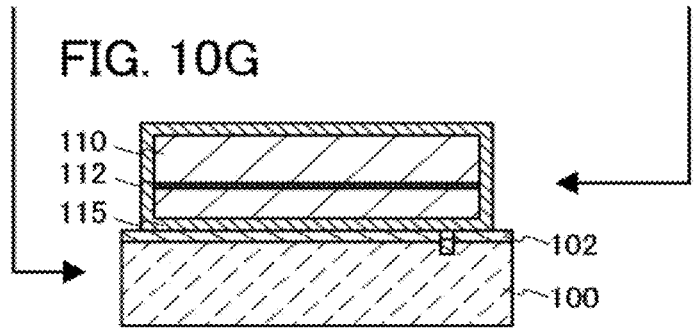

Next, a surface of the base substrate 100 and a surface of the single crystal semiconductor substrate 110 are disposed to face each other, and a surface of the nitrogen-containing layer 102 and a surface of the oxide film 115 are bonded to each other (see FIG. 10G).

Here, after the base substrate 100 and the single crystal semiconductor substrate 110 are disposed in close contact with each other with the nitrogen-containing layer 102 and the oxide film 115 interposed therebetween, a pressure of from 1 $N/cm^2$ to 500 $N/cm^2$ is applied to one portion of the base substrate 100 or the single crystal semiconductor substrate 110. Then, the bonding of the nitrogen-containing layer 102 and the oxide film 115 is initiated from the pressure-applied portion, and the bonding spontaneously proceeds in the entire area. This bonding step is performed under the action of the van der Waals force or hydrogen bonding and can be performed at room temperature.

Note that before the base substrate 100 and the single crystal semiconductor substrate 110 are bonded to each other, the oxide film 115 formed over the single crystal semiconductor substrate 110 and the nitrogen-containing layer 102 formed over the base substrate 100 are preferably subjected to surface treatment. For the details of the surface treatment, the above embodiment can also be referred to.

After the nitrogen-containing layer 102 and the oxide film 115 are bonded to each other, heat treatment for increasing the bonding strength is preferably performed. This heat treatment is performed at a temperature at which separation along the embrittled region 112 does not occur (for example, from room temperature to lower than 400° C.). Alternatively, the nitrogen-containing layer 102 and the oxide film 115 may be bonded to each other while being heated at a temperature within this range. The heat treatment can be performed using a diffusion furnace, a heating furnace such as a resistance heating furnace, a rapid thermal annealing (RTA) apparatus, a microwave heating apparatus, or the like.

Figure 10H:
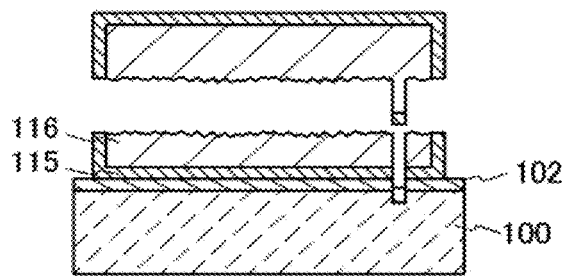

Next, the single crystal semiconductor substrate 110 is separated along the embrittled region 112 by performing the heat treatment, so that the single crystal semiconductor layer 116 is formed over the base substrate 100 with the nitrogen-containing layer 102 and the oxide film 115 interposed therebetween (see FIG. 10H and FIG. 11A). For the details of the heat treatment, the above embodiment can be referred to. Here, since bonding is not performed at the recessed portion 144, the single crystal semiconductor layer 116 is not formed in a region of the base substrate 100, which corresponds to the recessed portion 144. Such a region serves as a trigger for separation and thus, increase in surface roughness of the single crystal semiconductor layer 116 can be suppressed.

Figure 12A:
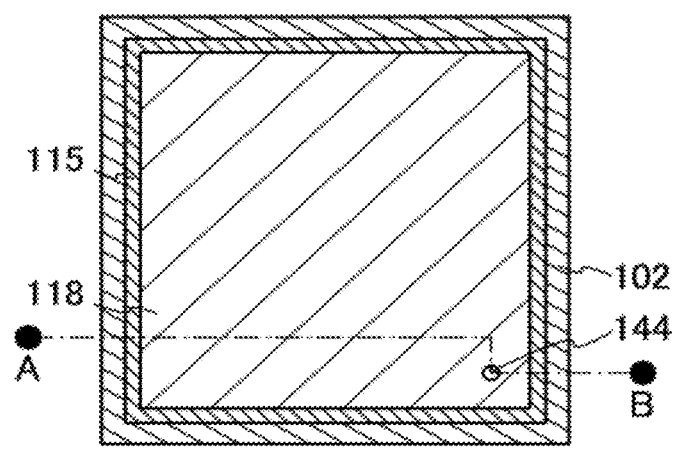
FIGS. 12A and 12B are plan views illustrating an example of a method for manufacturing an SOI substrate and a semiconductor device.

Next, a surface of the single crystal semiconductor layer 116 is irradiated with the laser beam 132 to form the single crystal semiconductor layer 118 with improved surface planarity and a reduced number of defects (see FIGS. 11B and 11C and FIG. 12A). FIG. 11C corresponds to a cross section taken along A-B in FIG. 12A. The above embodiment can be referred to for details.

Although the irradiation treatment with the laser beam 132 is performed just after the heat treatment for separation of the single crystal semiconductor layer 116 in this embodiment, an embodiment of the disclosed invention is not construed as being limited to this. Etching treatment may be performed after the heat treatment for separation of the single crystal semiconductor layer 116, to remove a region having many defects in the surface of the single crystal semiconductor layer 116, and then the irradiation treatment with the laser beam 132 may be performed. Alternatively, after improving planarity of the surface of the single crystal semiconductor layer 116 by etching treatment and the like, the irradiation treatment with the laser beam 132 may be performed. As the above etching treatment, either wet etching or dry etching may be employed.

Although not described in this embodiment, after the irradiation with the laser beam 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having a semiconductor layer with reduced surface roughness can be obtained (see FIG. 11C and FIG. 12A).

Figure 12B:
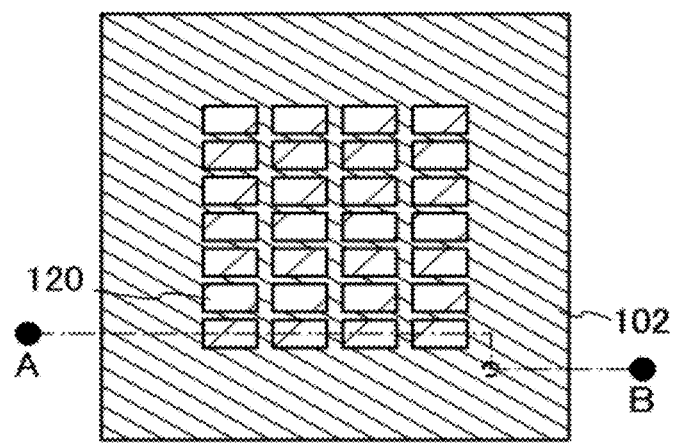

After the above steps, the single crystal semiconductor layer 118 of the SOI substrate may be patterned into the island-shaped semiconductor layer 120. In the patterning, the single crystal semiconductor layer 118 in the region corresponding to the above peripheral portion (the vicinity of the region where the recessed portion 144 is formed) is removed (see FIG. 11D and FIG. 12B). FIG. 11D corresponds to a cross section taken along A-B in FIG. 12B. The removal of the region corresponding to the peripheral portion is due to the high probability of peeling of the single crystal semiconductor layer 118 because of the insufficient bonding strength in this region. It is needless to say that the single crystal semiconductor layer 118 is not necessarily removed in the region corresponding to the peripheral portion.

Although the recessed portion is provided at a portion of the corner portion of the single crystal semiconductor layer in this embodiment (see FIG. 12A or the like), an embodiment of the disclosed invention is not limited thereto. The number, the position, or the like of the region where bonding is not performed may be set as appropriate. Further, in considering the improvement of the yield of manufacturing semiconductor devices, it is desirable to form the region where bonding is not performed in the region to be removed later (see FIG. 12B).

Note that the structure described in this embodiment can be used in appropriate combination with any of structures described in the other embodiments and example.

Embodiment 5

In this embodiment, a detailed method for manufacturing a semiconductor device in the above embodiment will be described with reference to FIGS. 13A to 13D, FIGS. 14A to 14D, and FIGS. 15A and 15B. Here, a method for manufacturing a semiconductor device including a plurality of transistors will be described as an example of the semiconductor device. Various semiconductor devices can be formed with the use of a combination of transistors described below.

Figure 13A:
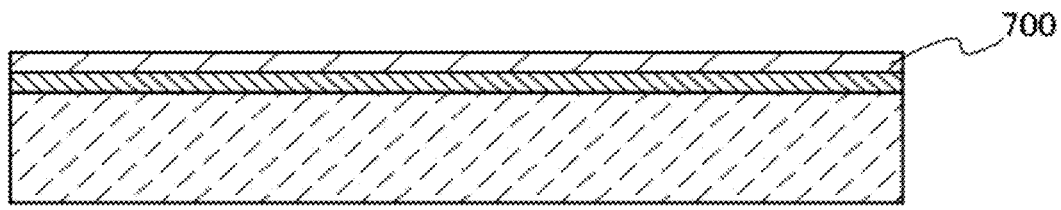
FIGS. 13A to 13D are cross-sectional views illustrating an example of a method for manufacturing a transistor.

FIG. 13A is a cross-sectional view illustrating part of a semiconductor substrate which is manufactured employing the method described in Embodiment 1 or the like (for example, see FIG. 2B or the like). Note that although the case where a semiconductor device is manufactured using the semiconductor substrate formed in Embodiment 1 is described in this embodiment, it is needless to say that a semiconductor substrate formed in any of the other embodiments may be used.

In order to control threshold voltages of TFTs, a p-type impurity element such as boron, aluminum, or gallium or an n-type impurity element such as phosphorus or arsenic may be added to a semiconductor layer 700 (corresponding to the single crystal semiconductor layer 118 in FIG. 2B). A region to which the impurity element is added and the kind of impurity element to be added can be changed as appropriate. For example, a p-type impurity element is added to a formation region of an n-channel TFT, and an n-type impurity element is added to a formation region of a p-channel TFT. The above impurity element may be added at a dose of from $1 \times 10^{15}/\text{cm}^2$ to $1 \times 10^{17}/\text{cm}^2$.

Figure 13B:
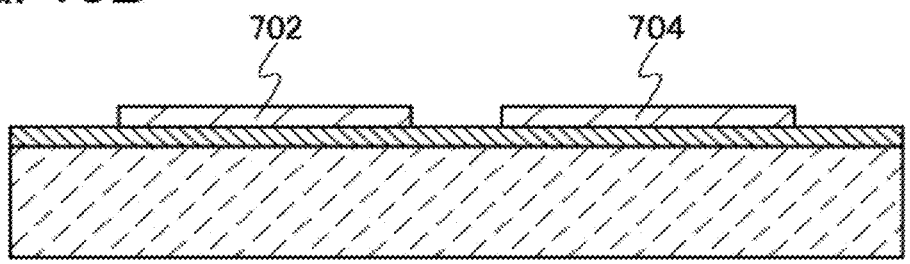

Then, the semiconductor layer 700 is divided into an island shape to form a semiconductor layer 702 and a semiconductor layer 704 (see FIG. 13B). Note that at that time, the single crystal semiconductor layer 118 is desirably removed in a region corresponding to a peripheral portion (the vicinity of a region where bonding is not performed) (for example, see FIG. 2C or the like).

Figure 13C:
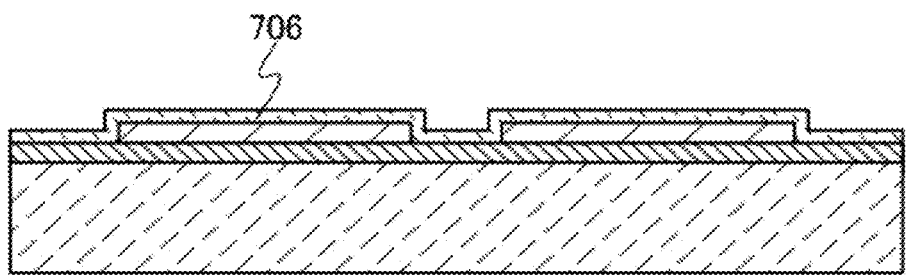

Next, a gate insulating film 706 is formed to cover the semiconductor layer 702 and the semiconductor layer 704 (see FIG. 13C). Here, a single-layer silicon oxide film is formed with a plasma CVD method. Alternatively, a film containing silicon oxynitride, silicon nitride oxide, silicon nitride, hafnium oxide, aluminum oxide, tantalum oxide, or the like may be formed to have a single-layer structure or a layered structure as the gate insulating film 706.

As a manufacturing method other than a plasma CVD method, a sputtering method or a method using oxidation or nitridation through high density plasma treatment can be given. High-density plasma treatment is performed using, for example, a mixed gas of a noble gas such as helium, argon, krypton, or xenon and a gas such as oxygen, nitrogen oxide, ammonia, nitrogen, or hydrogen. In this case, if plasma excitation is performed by introduction of microwaves, plasma with low electron temperature and high density can be generated. The surfaces of the semiconductor layers are oxidized or nitrided with oxygen radicals (OH radicals may be included) or nitrogen radicals (NH radicals may be included) which are generated by such high-density plasma, whereby the insulating film is formed to a thickness of from 1 nm to 20 nm, preferably, from 2 nm to 10 nm to be in contact with the semiconductor layers.

Since the oxidation or nitridation of the semiconductor layers through the above high-density plasma treatment is a solid-phase reaction, the interface state density between the gate insulating film 706 and each of the semiconductor layers 702 and 704 can be drastically reduced. Further, when the semiconductor layers 702 and 704 are directly oxidized or nitrided by the high-density plasma treatment, variation in the thickness of the insulating film to be formed can be suppressed. Since the semiconductor layers are single crystal films, even when the surfaces of the semiconductor layers are oxidized by a solid-phase reaction by using the high-density plasma treatment, a gate insulating film with high uniformity and low interface state density can be formed. When an insulating film formed through high-density plasma treatment as described above is used for a part or whole of the gate insulating film of a transistor, variation in characteristics can be suppressed.

Alternatively, the gate insulating film 706 may be formed by thermally oxidizing the semiconductor layer 702 and the semiconductor layer 704. In the case of such thermal oxidation, it is necessary to use a glass substrate having a certain degree of heat resistance.

Note that after a gate insulating film 706 containing hydrogen is formed, hydrogen contained in the gate insulating film 706 may be dispersed into the semiconductor layer 702 and the semiconductor layer 704 by performing heat treatment at a temperature of from 350° C. to 450° C. In this case, the gate insulating film 706 can be formed using silicon nitride or silicon nitride oxide with a plasma CVD method. Note that the process temperature is preferably 350° C. or lower. If hydrogen is supplied to the semiconductor layer 702 and the semiconductor layer 704 in this manner, defects in the semiconductor layer 702, in the semiconductor layer 704, at the interface between the gate insulating film 706 and the semiconductor layer 702, and at the interface between the gate insulating film 706 and the semiconductor layer 704 can be effectively reduced.

Figure 13D:
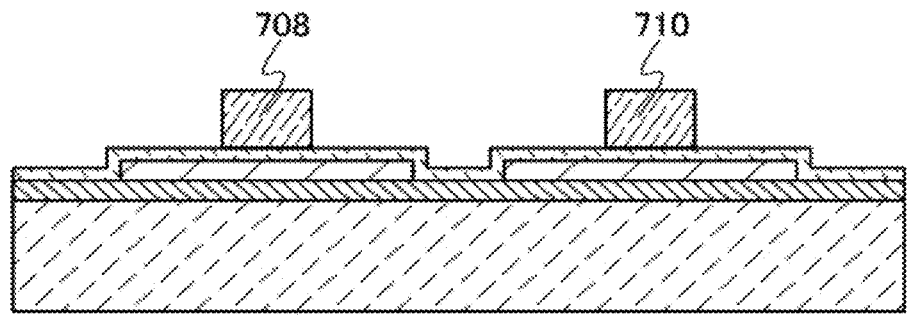

Next, a conductive film is formed over the gate insulating film 706, and then, the conductive film is processed (patterned) into a predetermined shape, whereby an electrode 708 and an electrode 710 are formed over the semiconductor layer 702 and the semiconductor layer 704, respectively (see FIG. 13D). The conductive film can be formed with a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above metal as its main component or a compound containing the above metal may be used. Still alternatively, a semiconductor material, such as polycrystalline silicon which is obtained by doping a semiconductor with an impurity element that imparts a conductivity type, may be used.

Although the electrodes 708 and 710 are formed using a single-layer conductive film in this embodiment, the semiconductor device according to an embodiment of the disclosed invention is not limited to this structure. Each of the electrodes 708 and 710 may be formed with plural stacked conductive films. In the case of a two-layer structure, for example, a molybdenum film, a titanium film, a titanium nitride film, or the like may be used as the lower layer, and an aluminum film or the like may be used as the upper layer. In the case of a three-layer structure, a layered structure of a molybdenum film, an aluminum film, and a molybdenum film, a layered structure of a titanium film, an aluminum film, and a titanium film, or the like may be used.

Note that a mask used for forming the electrodes 708 and 710 may be formed using a material such as silicon oxide or silicon nitride oxide. In this case, a step of forming a mask by patterning a silicon oxide film, a silicon nitride oxide film, or the like is additionally needed. However, decrease in film thickness of the mask in etching is smaller than that in the case of using a resist material; thus, the electrodes 708 and 710 with more precise shapes can be formed. Alternatively, the electrodes 708 and 710 may be selectively formed employing a droplet discharge method without using a mask. Here, a droplet discharge method refers to a method in which droplets containing a predetermined composition are discharged or ejected to form a predetermined pattern, and includes an ink jet method and the like in its category.

Alternatively, the electrodes 708 and 710 can be formed by etching the conductive film to have desired tapered shapes with an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape may be adjusted with the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 14A:
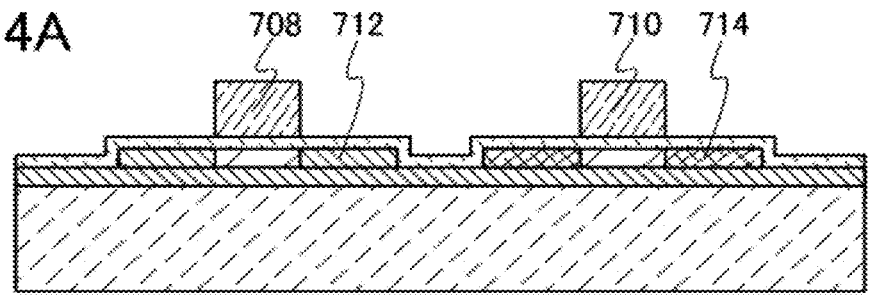
FIGS. 14A to 14D are cross-sectional views illustrating an example of a method for manufacturing a transistor.

Next, an impurity element imparting one conductivity type is added to the semiconductor layer 702 and the semiconductor layer 704 by using the electrodes 708 and 710 as masks (see FIG. 14A). In this embodiment, an impurity element imparting n-type conductivity (such as phosphorus or arsenic) is added to the semiconductor layer 702, and an impurity element imparting p-type conductivity (such as boron) is added to the semiconductor layer 704. Note that when the impurity element imparting n-type conductivity is added to the semiconductor layer 702, the semiconductor layer 704 to which the p-type impurity element is added is covered with a mask or the like so that the impurity element imparting n-type conductivity is added to the semiconductor layer 702 selectively. When the impurity element imparting p-type conductivity is added to the semiconductor layer 704, the semiconductor layer 702 to which the impurity element imparting n-type conductivity is added is covered with a mask or the like so that the impurity element imparting p-type conductivity is added to the semiconductor layer 704 selectively. Alternatively, after one of the impurity element imparting p-type conductivity and the impurity element imparting n-type conductivity is added to the semiconductor layers 702 and 704, the other of the impurity element imparting p-type conductivity and the impurity element imparting n-type conductivity may be added to only one of the semiconductor layers at a higher concentration. By the addition of the impurity elements, impurity regions 712 and impurity regions 714 are formed in the semiconductor layer 702 and the semiconductor layer 704, respectively.

Figure 14B:
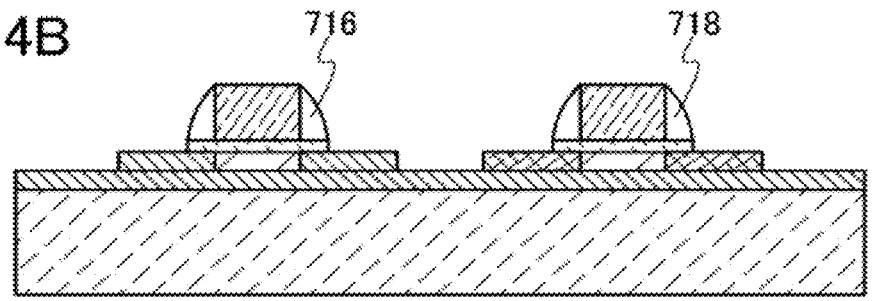

Next, sidewalls 716 are formed on side surfaces of the electrode 708, and sidewalls 718 are formed on side surfaces of the electrode 710 (see FIG. 14B). The sidewalls 716 and 718 can be formed by, for example, newly forming an insulating film so as to cover the gate insulating film 706 and the electrodes 708 and 710 and partly etching the newly formed insulating film with anisotropic etching. Note that the gate insulating film 706 may also be etched partly with the anisotropic etching described above. For the insulating film used for forming the sidewalls 716 and 718, a film containing silicon, silicon oxide, silicon nitride, silicon oxynitride, silicon nitride oxide, an organic material, or the like may be formed to have a single layer structure or a layered structure with a plasma CVD method, a sputtering method, or the like. In this embodiment, a 100 nm-thick silicon oxide film is formed with a plasma CVD method. In addition, as an etching gas, a mixed gas of $CHF_3$ and helium can be used. Note that the steps of forming the sidewalls 716 and 718 are not limited to the steps described here.

Figure 14C:
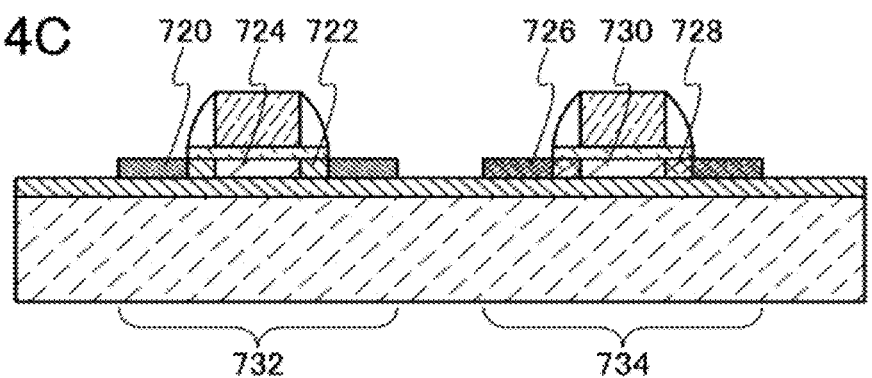

Next, impurity elements each imparting one conductivity type are added to the semiconductor layers 702 and 704 using the gate insulating film 706, the electrodes 708 and 710, and the sidewalls 716 and 718 as masks (see FIG. 14C). Note that the impurity elements imparting the same conductivity types as the impurity elements which are added to the semiconductor layers 702 and 704 in the previous step are added to the semiconductor layers 702 and 704 at higher concentrations. Here, when the impurity element imparting n-type conductivity is added to the semiconductor layer 702, the semiconductor layer 704 to which the p-type impurity element is added is covered with a mask or the like so that the impurity element imparting n-type conductivity is added to the semiconductor layer 702 selectively. When the impurity element imparting p-type conductivity is added to the semiconductor layer 704, the semiconductor layer 702 to which the impurity element imparting n-type conductivity is added is covered with a mask or the like so that the impurity element imparting p-type conductivity is added to the semiconductor layer 704 selectively.

By the addition of the impurity element, a pair of high-concentration impurity regions 720, a pair of low-concentration impurity regions 722, and a channel formation region 724 are formed in the semiconductor layer 702. In addition, by the addition of the impurity element, a pair of high-concentration impurity regions 726, a pair of low-concentration impurity regions 728, and a channel formation region 730 are formed in the semiconductor layer 704. The high-concentration impurity regions 720 and the high-concentration impurity regions 726 each function as a source or a drain, and the low-concentration impurity regions 722 and the low-concentration impurity regions 728 each function as a lightly doped drain (LDD) region.

Note that the sidewalls 716 formed over the semiconductor layer 702 and the sidewalls 718 formed over the semiconductor layer 704 may be formed so as to have the same length or different lengths in a direction in which carriers are transported (in a direction parallel to a so-called channel length). For example, each of the sidewalls 718 over the semiconductor layer 704 which constitutes part of a p-channel transistor is preferably formed to have a longer length in the direction in which carriers are transported than that of each of the sidewalls 716 over the semiconductor layer 702 which constitutes part of an n-channel transistor. By increasing the lengths of the sidewalls 718 of the p-channel transistor, a short channel effect due to diffusion of boron can be suppressed; therefore, boron can be added to the source and the drain at high concentration. Accordingly, the resistance of the source and the drain can be reduced.

In order to further reduce the resistance of the source and the drain, a silicide region may be formed by forming silicide in part of the semiconductor layers 702 and 704. The silicide is formed by placing a metal in contact with the semiconductor layers and allowing the metal and silicon in the semiconductor layers to be reacted by heat treatment (e.g., a GRTA method, an LRTA method, or the like). For the silicide region, cobalt silicide, nickel silicide, or the like may be used. In the case where the semiconductor layers 702 and 704 are thin, silicide reaction may proceed to the bottoms of the semiconductor layers 702 and 704. As a metal used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser beam irradiation or the like.

Through the above steps, an n-channel transistor 732 and a p-channel transistor 734 are formed. Note that although conductive films each serving as a source electrode or a drain electrode have not been formed at the stage in FIG. 14C, a structure including these conductive films each serving as a source electrode or a drain electrode may also be referred to as a transistor.

Figure 14D:
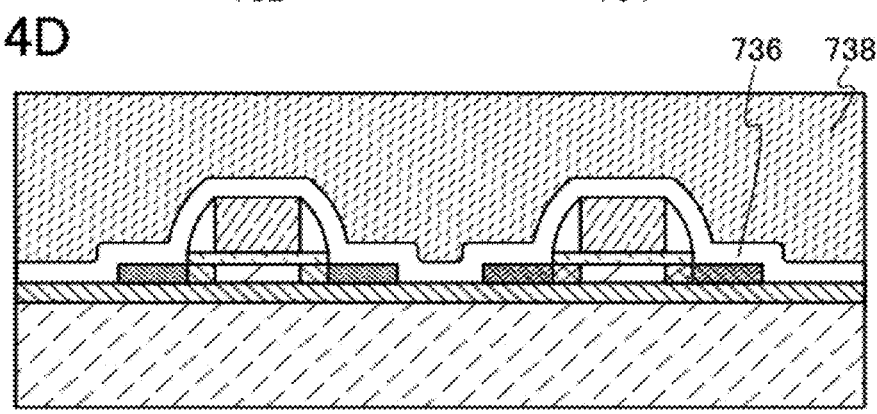

Next, an insulating film 736 is formed so as to cover the n-channel transistor 732 and the p-channel transistor 734 (see FIG. 14D). The insulating film 736 is not always necessary; however, the formation of the insulating film 736 can prevent impurities such as an alkali metal and an alkaline earth metal from contaminating the n-channel transistor 732 and the p-channel transistor 734. Specifically, the insulating film 736 is desirably formed using a material such as silicon oxide, silicon nitride, silicon oxynitride, silicon nitride oxide, aluminum nitride, or aluminum oxide. In this embodiment, a silicon nitride oxide film with a thickness of approximately 600 nm is used as the insulating film 736. In this case, the above hydrogenation step may be performed after the silicon nitride oxide film is formed. Note that although the insulating film 736 is formed to have a single-layer structure in this embodiment, it is needless to say that the insulating film 736 may have a layered structure. For example, in the case of a two-layer structure, the insulating film 736 may have a layered structure of a silicon oxynitride film and a silicon nitride oxide film.

Next, an insulating film 738 is formed over the insulating film 736 so as to cover the n-channel transistor 732 and the p-channel transistor 734. The insulating film 738 may be formed using an organic material having heat resistance, such as a polyimide, an acrylic resin, a benzocyclobutene-based resin, a polyamide, or an epoxy resin. Other than such an organic material, it is also possible to use a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, and aromatic hydrocarbon as a substituent. Alternatively, the insulating film 738 may be formed by stacking plural insulating films using any of these materials.

For the formation of the insulating film 738, the following method can be employed depending on the material of the insulating film 738: a CVD method, a sputtering method, an SOG method, a spin coating method, a dipping method, a spray coating method, a droplet discharge method (e.g., an ink jet method, screen printing, offset printing, or the like), a roll coating method, a curtain coating method, a knife coating method, or the like.

Next, contact holes are formed in the insulating films 736 and 738 so that each of the semiconductor layers 702 and 704 is partly exposed. Then, conductive films 740 and 742 are formed in contact with the semiconductor layer 702 through the contact holes, and conductive films 744 and 746 are formed in contact with the semiconductor layer 704 through the contact holes (see FIG. 15A). The conductive films 740, 742, 744, and 746 serve as source electrodes and drain electrodes of the transistors. Note that in this embodiment, as an etching gas used for forming the contact holes, a mixed gas of $CHF_3$ and He is used; however, the etching gas is not limited thereto.

The conductive films 740, 742, 744, and 746 can be formed by a CVD method, a sputtering method, or the like. As the material, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing any of the above materials as its main component or a compound containing any of the above materials may be used. The conductive films 740, 742, 744, and 746 may each have a single-layer structure or a layered structure.

As examples of an alloy containing aluminum as its main component, an alloy containing aluminum as its main component and also containing nickel, and an alloy containing aluminum as its main component and also containing nickel and one or both of carbon and silicon can be given. Since aluminum and aluminum silicon (Al—Si) have low resistance and are inexpensive, aluminum and aluminum silicon are suitable as a material for forming the conductive films 740, 742, 744, and 746. In particular, aluminum silicon is preferable because generation of a hillock due to resist baking at the time of patterning can be suppressed. Further, a material in which Cu is mixed into aluminum at approximately 0.5% may be used instead of silicon.

In the case where each of the conductive films 740, 742, 744, and 746 is formed to have a layered structure, a layered structure of a barrier film, an aluminum silicon film, and a barrier film, a layered structure of a barrier film, an aluminum silicon film, a titanium nitride film, and a barrier film, or the like may be employed, for example. Note that a barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be sufficiently prevented. Moreover, by forming the barrier film using titanium that is a highly reducible element, even if a thin oxide film is formed on the semiconductor layers 702 and 704, the oxide film is reduced by the titanium contained in the barrier film, whereby favorable contact can be obtained between the semiconductor layer 702 and the conductive films 740 and 742 and between the semiconductor layer 704 and the conductive films 744 and 746. Further, it is also possible to stack a plurality of barrier films. In that case, for example, each of the conductive films 740, 742, 744, and 746 can be formed to have a five-layer structure of titanium, titanium nitride, aluminum silicon, titanium, and titanium nitride in order from the bottom or a layered structure of more than five layers.

For the conductive films 740, 742, 744, and 746, tungsten silicide formed with a chemical vapor deposition method using a $WF_6$ gas and a $SiH_4$ gas may be used. Alternatively, tungsten formed by hydrogenation of $WF_6$ may be used for the conductive films 740, 742, 744, and 746.

Note that the conductive films 740 and 742 are connected to the high-concentration impurity regions 720 of the n-channel transistor 732. The conductive films 744 and 746 are connected to the high-concentration impurity regions 726 of the p-channel transistor 734.

Figure 15A:
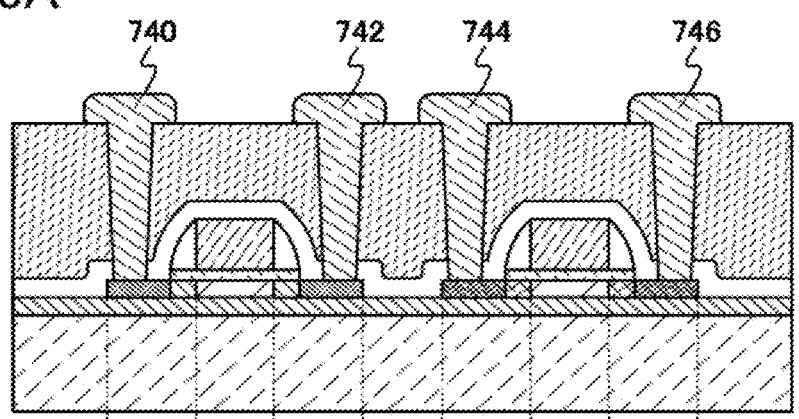
FIGS. 15A and 15B are a cross-sectional view of a transistor and a plan view thereof, respectively.
Figure 15B:
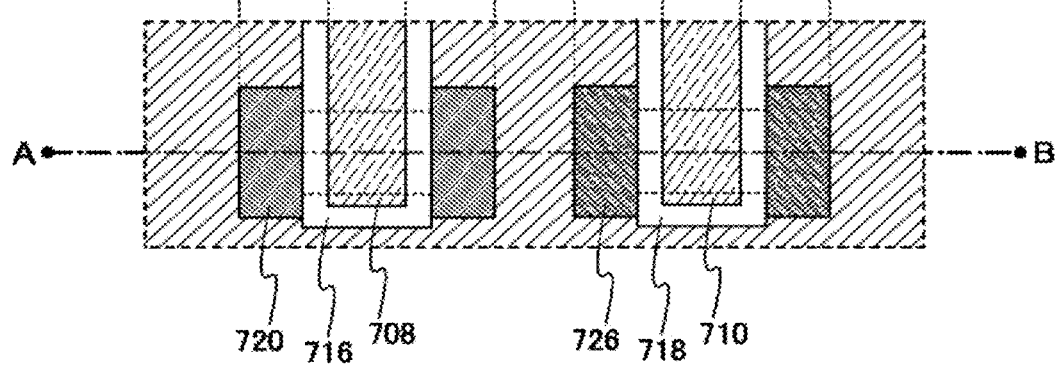

FIG. 15B is a plan view of the n-channel transistor 732 and the p-channel transistor 734 which are illustrated in FIG. 15A. Here, a cross-sectional view taken along A-B in FIG. 15B corresponds to FIG. 15A. Note that in FIG. 15B, the conductive films 740, 742, 744, and 746, the insulating films 736 and 738, and the like are omitted for simplicity.

Note that although the case where the n-channel transistor 732 and the p-channel transistor 734 each include one electrode serving as a gate electrode (the case where the n-channel transistor 732 and the p-channel transistor 734 include the electrodes 708 and 710) is described in this embodiment as an example, an embodiment of the disclosed invention is not limited to this structure. The transistors may have a multi-gate structure in which a plurality of electrodes serving as gate electrodes are included and electrically connected to one another.

In this embodiment, an SOI substrate having a semiconductor layer with reduced surface roughness is used; therefore, the yield of manufacturing semiconductor devices can be improved. Note that the structure described in this embodiment can be used in appropriate combination with any of structures described in the other embodiments and example.

Example 1

In this example, effects of the methods described in the above embodiments were confirmed. The results will be described below with reference to drawings.

Samples were each prepared by providing over a glass substrate a silicon layer separated from a single crystal silicon substrate (laser beam irradiation was not performed). Specifically, three kinds of samples were prepared: a sample obtained without forming a region where bonding is not performed (sample A), a sample obtained by damaging (forming a projected and recessed portion) a glass substrate with a glass pen to form a region where bonding is not performed (sample B), and a sample obtained by damaging (forming a projected and recessed portion) a glass substrate by laser irradiation to form a region where bonding is not performed (sample C). Details of the manufacturing method of the samples are the same as those in Embodiment 2 or the like and thus are omitted. Note that the sample A was formed without forming a projected and recessed portion in Embodiment 2 or the like.

Figure 16A:
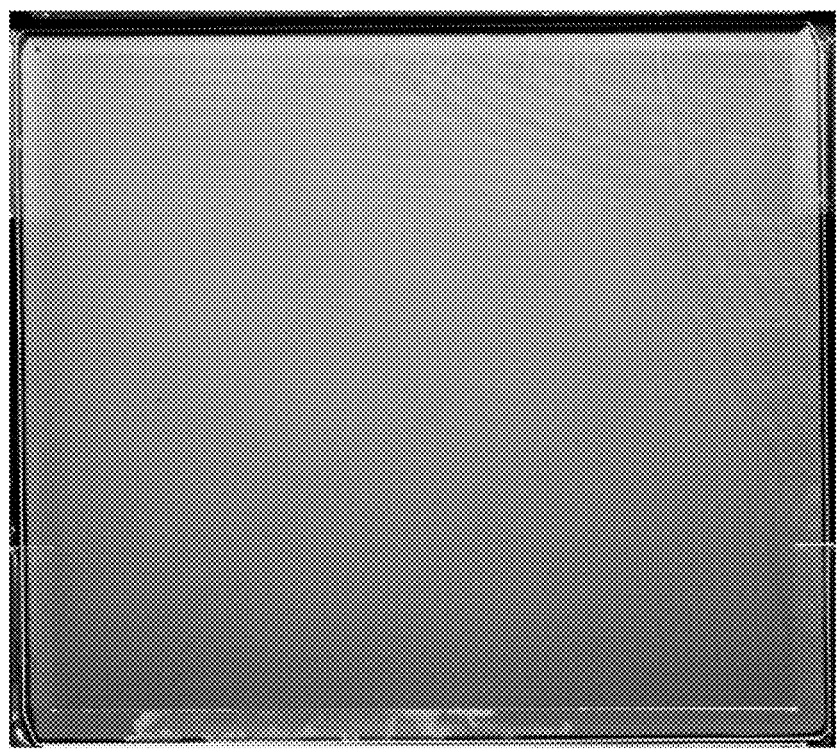
FIGS. 16A and 16B show a surface of a silicon layer.
Figure 16B:
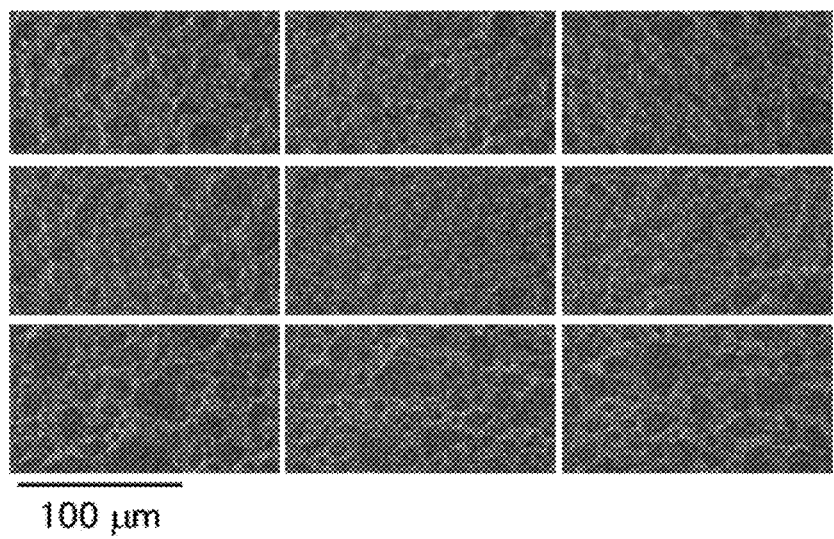
Figure 17A:
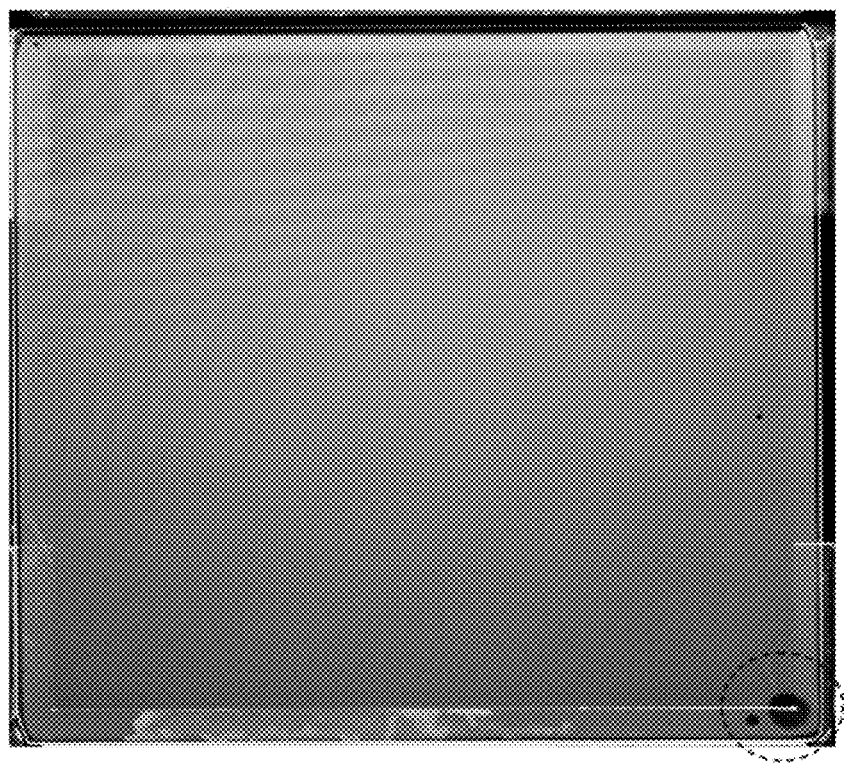
FIGS. 17A and 17B show a surface of a silicon layer.
Figure 17B:
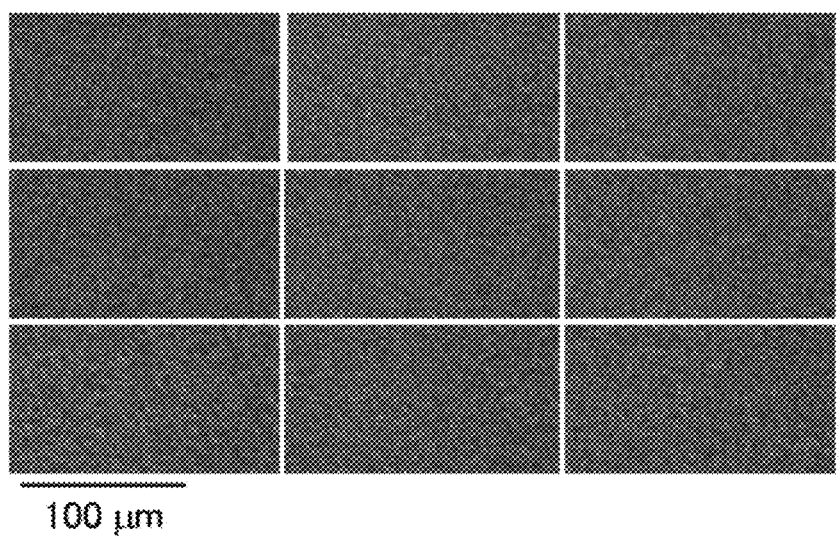
Figure 18A:
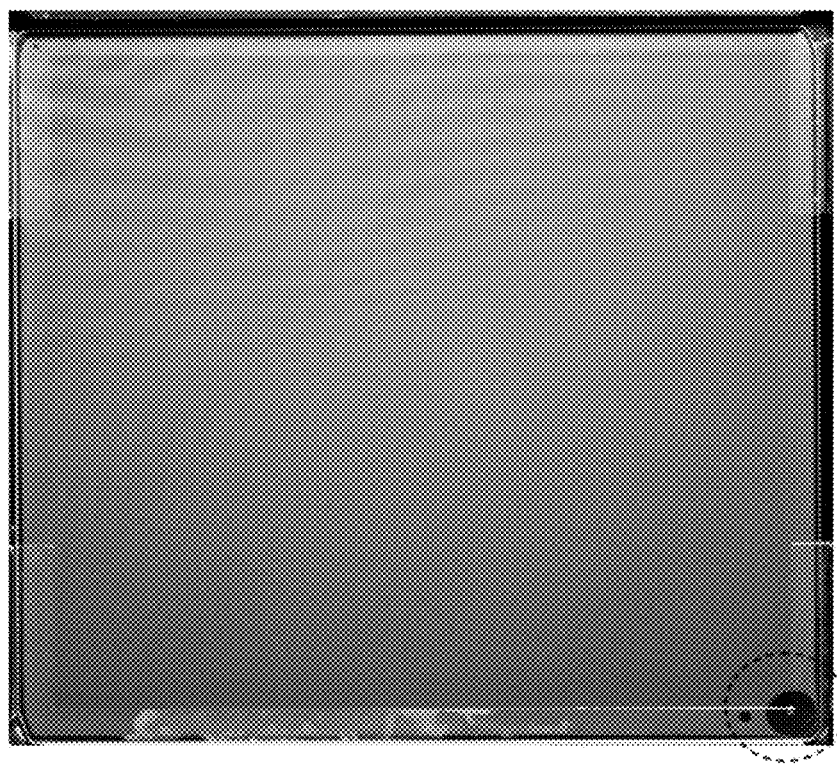
FIGS. 18A and 18B show a surface of a silicon layer.
Figure 18B:
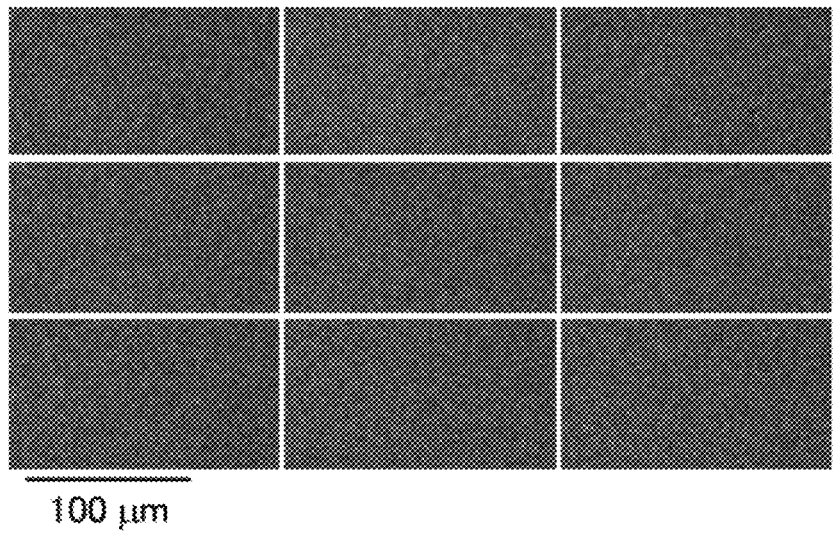
Figure 19:
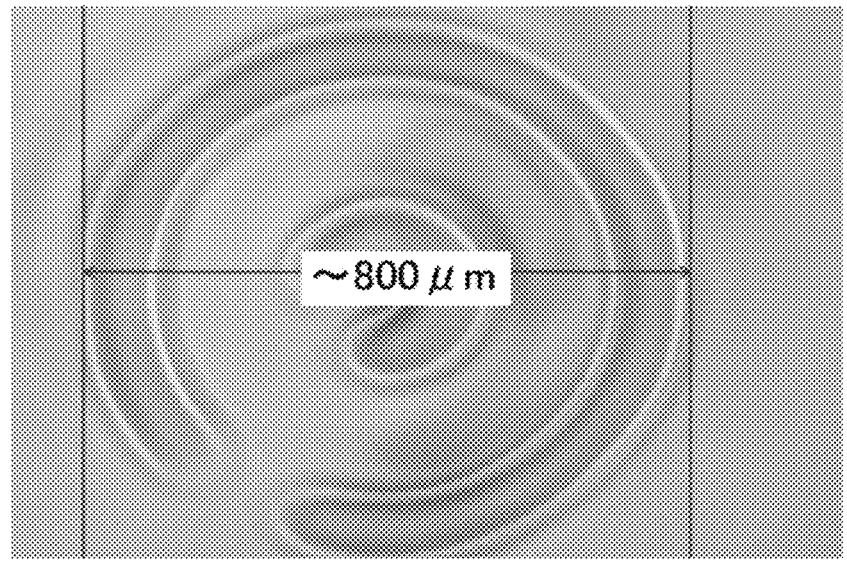
FIG. 19 shows an example of a surface of a glass substrate.

FIGS. 16A and 16B, FIGS. 17A and 17B, and FIGS. 18A and 18B each show a surface of the silicon layer just after forming over a glass substrate the silicon layer separated from a single crystal silicon substrate. FIGS. 16A and 16B each show the sample A, FIGS. 17A and 17B each show the sample B, and FIGS. 18A and 18B each show the sample C. Note that FIG. 16B, FIG. 17B, and FIG. 18B are locally expanded photographs (photomicrographs) in FIG. 16A, FIG. 17A, and FIG. 18A, respectively. In addition, FIG. 19 shows an example of the surface of the glass substrate damaged by laser irradiation. Note that in FIG. 19, the size of the damage was approximately 800 μm (0.8 mm) in diameter.

As for each of the sample B and the sample C, a region where bonding is not performed is formed at a bottom-right portion in each drawing (a corner portion: an area surrounded by a dotted circle in each drawing) (see FIG. 17A and FIG. 18A). Bonding of the glass substrate and the single crystal silicon substrate proceeded from the portion (the corner portion). Note that a certain advantageous effect was obtained even when bonding proceeds from a portion other than the portion (the corner portion); however, when bonding proceeded from the portion (the corner portion), the largest effect was obtained.

From FIG. 16B, FIG. 17B, and FIG. 18B, it is found that surface roughness of the silicon layers of the samples each having a region where bonding is not performed (the sample B and the sample C) is reduced as compared to the sample without a region where bonding is not performed (the sample A).

Figure 20:
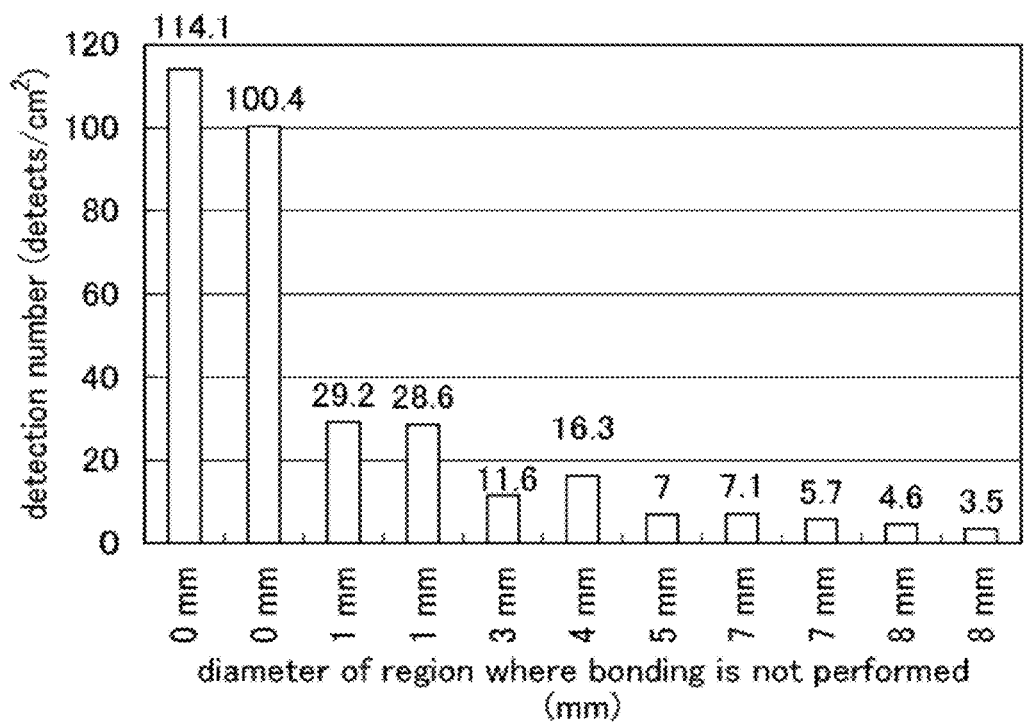
FIG. 20 is a graph showing the relation between diameters of a region where bonding is not performed and the number of defects.

FIG. 20 shows the relation between diameters of regions where bonding is not performed and the number (detection number) of defects in a silicon layer. Here, the detection number refers to the number of defects each having a size of 1 μm or longer in diameter, which were detected by a pattern detector. Note that the pattern detector is equipment to which an optical microscope and image analysis are applied.

From FIG. 20, it is found that as the diameter of the region where bonding is not performed increases, the detection number of defects is reduced. For example, the number density of defects can be reduced to 5.0 defects/$cm^2$ or less and can also be reduced to 1.0 defects/$cm^2$ or less depending on a condition. Even when the region where bonding is not performed is very small (for example, when the diameter of the region where bonding is not performed is 1 mm), the detection number is significantly small as compared to the case where the region where bonding is not performed is not formed (the case where the diameter of the region where bonding is not performed is 0 mm). These results lead to a conclusion that formation of the region where bonding is not performed is extremely efficient for suppressing the formation of defects in the silicon layer. Note that the size of the region where bonding is not performed depends on the size of a projected and recessed portion formed in a bonding surface, or the like.

Figure 21A:
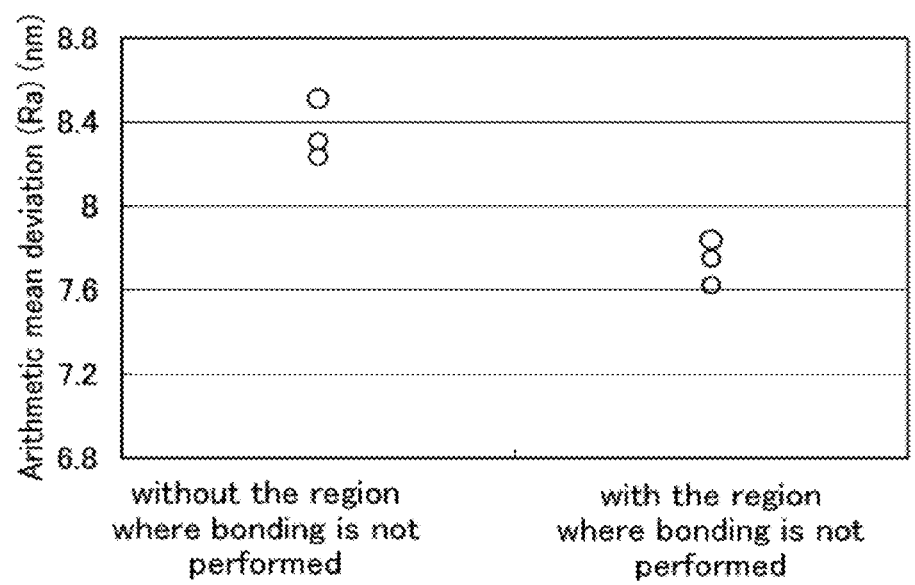
FIGS. 21A and 21B are graphs showing results obtained by comparing surface roughness.
Figure 21B:
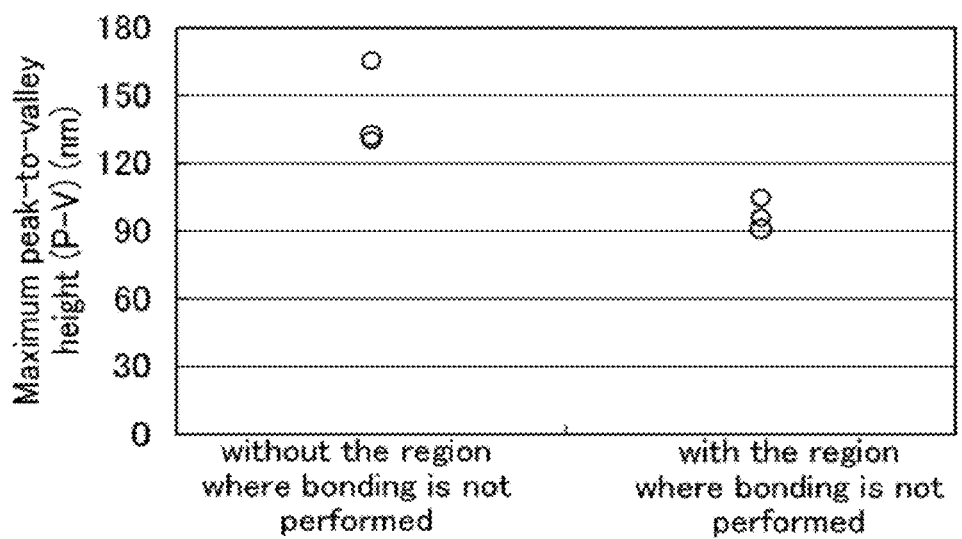

FIGS. 21A and 21B show results obtained by comparing roughness of the surface of the sample without the region where bonding is not performed and roughness of the surface of the sample having the region where bonding is not performed (the observed area was 10×10 $mm^2$). FIG. 21A shows arithmetic mean deviation (Ra) and FIG. 21B shows the maximum peak-to-valley height (P-V).

From FIG. 21A, it is found that Ra of the sample without the region where bonding is not performed is more than 8.0 nm whereas Ra of the sample having the region where bonding is not performed is 8.0 nm or less. In addition, from FIG. 21B, it is found that P-V of the sample without the region where bonding is not performed is more than 120 nm whereas P-V of the sample having the region where bonding is not performed is 120 nm or less.

As described above, Example 1 reveals efficiency of an embodiment of the disclosed invention. Note that according to an embodiment of the disclosed invention, the number of defects of a semiconductor layer can be sufficiently reduced and each defect can be small; therefore, it is possible to suppress an increase in the number and size of defects even in the case where laser beam irradiation is performed later. Thus, an embodiment of the disclosed invention is more extremely effective when used in combination with laser beam irradiation.

This application is based on Japanese Patent Application serial no. 2009-117263 filed with Japan Patent Office on May 14, 2009, the entire contents of which are hereby incorporated by reference.

What is claimed is:

1. A silicon-on-insulator substrate comprising:
a substrate whose upper surface comprises a first region, a second region, and a third region, wherein the first region is surrounded by the second region and the second region is surrounded by the third region;
an insulating layer covering the second region; and
a single crystal semiconductor layer covering the insulating layer,
wherein the upper surface of the substrate is exposed in the first region and the third region, and
wherein the first region is closer to a border between the second region and the third region than a center of the second region.

2. The silicon-on-insulator substrate according to claim 1, wherein the first region and the third region are coplanar with each other.

3. The silicon-on-insulator substrate according to claim 1, wherein a side surface of the insulating layer and a side surface of the single crystal semiconductor layer are coplanar with each other.

4. The silicon-on-insulator substrate according to claim 1, wherein the substrate is an insulator.

5. The silicon-on-insulator substrate according to claim 1, wherein a diameter of the first region is equal to or larger than 1 mm.

6. The silicon-on-insulator substrate according to claim 1, wherein arithmetic mean deviation of a top surface of the single crystal semiconductor layer is equal to or less than 8.0 nm.

7. The silicon-on-insulator substrate according to claim 1, wherein the maximum peak-to-valley height of a top surface of the single crystal semiconductor layer is equal to or less than 120 nm.

8. A silicon-on-insulator substrate comprising:
a substrate whose upper surface comprises a first region, a second region, and a third region, wherein the first region is surrounded by the second region and the second region is surrounded by the third region;
an insulating layer covering the second region; and
a single crystal semiconductor layer covering the insulating layer,
wherein the upper surface of the substrate is exposed in the first region and the third region,
wherein the substrate has a recessed portion in the first region,
wherein the first region is closer to a border between the second region and the third region than a center of the second region.

9. The silicon-on-insulator substrate according to claim 8, wherein a side surface of the insulating layer and a side surface of the single crystal semiconductor layer are coplanar with each other.

10. The silicon-on-insulator substrate according to claim 8, wherein the substrate is an insulator.

11. The silicon-on-insulator substrate according to claim 8, wherein a diameter of the first region is equal to or larger than 1 mm.

12. The silicon-on-insulator substrate according to claim 8, wherein arithmetic mean deviation of a top surface of the single crystal semiconductor layer is equal to or less than 8.0 nm.

13. The silicon-on-insulator substrate according to claim 8, wherein the maximum peak-to-valley height of a top surface of the single crystal semiconductor layer is equal to or less than 120 nm.

14. A silicon-on-insulator substrate comprising:
a substrate whose upper surface comprises a first region, a second region, and a third region, wherein the first region is surrounded by the second region and the second region is surrounded by the third region;
an insulating layer covering the first region, the second region, and the third region;
an oxide film over the insulating layer and covering the second region; and
a single crystal semiconductor layer over the oxide film,
wherein an upper surface of the insulating layer is exposed in the first region and the third region, and
wherein the first region is closer to a border between the second region and the third region than a center of the second region.

15. The silicon-on-insulator substrate according to claim 14, wherein the first region and the third region are coplanar with each other.

16. The silicon-on-insulator substrate according to claim 14, wherein the upper surface of the insulating layer in the first region and the upper surface of the insulating layer in the third region are coplanar with each other.

17. The silicon-on-insulator substrate according to claim 14, wherein a side surface of the oxide film and a side surface of the single crystal semiconductor layer are coplanar with each other on a border between the first region and the second region.

18. The silicon-on-insulator substrate according to claim 14, wherein a side surface of the single crystal semiconductor layer is covered by the oxide film on the border between the second region and the third region.

19. The silicon-on-insulator substrate according to claim 14, wherein the substrate is an insulator.

20. The silicon-on-insulator substrate according to claim 14, wherein a diameter of the first region is equal to or larger than 1 mm.

21. The silicon-on-insulator substrate according to claim 14, wherein arithmetic mean deviation of a top surface of the single crystal semiconductor layer is equal to or less than 8.0 nm.

22. The silicon-on-insulator substrate according to claim 14, wherein the maximum peak-to-valley height of a top surface of the single crystal semiconductor layer is equal to or less than 120 nm.

23. A silicon-on-insulator substrate comprising:
a substrate whose upper surface comprises a first region, a second region, and a third region, wherein the first region is surrounded by the second region and the second region is surrounded by the third region;
an insulating layer covering the first region, the second region, and the third region;
an oxide film over the insulating layer and covering the second region; and
a single crystal semiconductor layer over the oxide film and covering the second region, wherein an upper surface of the insulating layer is exposed in the first region and the third region, wherein the substrate has a recessed portion in the first region, wherein the first region is closer to a border between the second region and the third region than a center of the second region.

24. The silicon-on-insulator substrate according to claim 23, wherein a side surface of the oxide film and a side surface of the single crystal semiconductor layer are coplanar with each other on a border between the first region and the second region.

25. The silicon-on-insulator substrate according to claim 23, wherein a side surface of the single crystal semiconductor layer is covered by the oxide film on the border between the second region and the third region.

26. The silicon-on-insulator substrate according to claim 23, wherein the substrate is an insulator.

27. The silicon-on-insulator substrate according to claim 23, wherein a diameter of the first region is equal to or larger than 1 mm.

28. The silicon-on-insulator substrate according to claim 23, wherein arithmetic mean deviation of a top surface of the single crystal semiconductor layer is equal to or less than 8.0 nm.

29. The silicon-on-insulator substrate according to claim 23, wherein the maximum peak-to-valley height of a top surface of the single crystal semiconductor layer is equal to or less than 120 nm.

* * * * *